(12) United States Patent
Kim

(10) Patent No.: US 8,664,538 B2
(45) Date of Patent: Mar. 4, 2014

(54) TERMINAL-INTEGRATED METAL BASE PACKAGE MODULE AND TERMINAL-INTEGRATED METAL BASE PACKAGING METHOD

(75) Inventor: Kyoung-Min Kim, Seoul (KR)

(73) Assignees: Wavenics Inc., Daejeon (KR); Lumens Co., Ltd., Yongin-Si (KR)

( * ) Notice: Subject to any disclaimer, the term of this patent is extended or adjusted under 35 U.S.C. 154(b) by 0 days.

(21) Appl. No.: 13/060,097

(22) PCT Filed: Apr. 30, 2010

(86) PCT No.: PCT/KR2010/002754
§ 371 (c)(1),
(2), (4) Date: Feb. 22, 2011

(87) PCT Pub. No.: WO2011/136417
PCT Pub. Date: Nov. 3, 2011

(65) Prior Publication Data
US 2013/0037309 A1 Feb. 14, 2013

(51) Int. Cl.
*H05K 1/16* (2006.01)
*H05K 3/30* (2006.01)
(52) U.S. Cl.
USPC .............................. 174/260; 29/832
(58) Field of Classification Search
USPC .............. 174/256, 260; 257/81, 675, 676
See application file for complete search history.

(56) References Cited

U.S. PATENT DOCUMENTS

| | | | |
|---|---|---|---|
| 6,984,852 B2 * | 1/2006 | Wang et al. | 257/99 |
| 7,166,496 B1 * | 1/2007 | Lopez et al. | 257/E23.044 |
| 2003/0160317 A1 * | 8/2003 | Sakamoto et al. | 257/690 |
| 2006/0279949 A1 * | 12/2006 | Shin et al. | 257/99 |
| 2007/0023893 A1 * | 2/2007 | Shin et al. | 257/713 |
| 2007/0221928 A1 * | 9/2007 | Lee et al. | 257/79 |
| 2007/0235743 A1 * | 10/2007 | Lee et al. | 257/81 |
| 2009/0277675 A1 * | 11/2009 | Koyama | 174/260 |
| 2011/0042699 A1 * | 2/2011 | Park et al. | 257/98 |

FOREIGN PATENT DOCUMENTS

| | | |
|---|---|---|
| KR | 10-2005-0044178 | 5/2005 |
| KR | 10-2006-0128443 | 12/2006 |

* cited by examiner

*Primary Examiner* — Chau Nguyen
*Assistant Examiner* — Roshn Varghese
(74) *Attorney, Agent, or Firm* — Lexyoume IP Meister, PLLC

(57) ABSTRACT

The present invention relates to a terminal-integrated package method for a metal base package module that can effectively prevent short-circuit or breakage by not using wire bonding for connection with an external circuit.

The terminal-integrated package method for the metal base package module includes: preparing a metal substrate formed with a conductive metal material; forming an oxide layer by oxidizing one side of the metal substrate to a predetermined depth; forming an insulation groove by partially eliminating the metal substrate to the oxide layer with a constant width along the circumference of the metal substrate from an opposite side of the metal substrate; forming a plurality of external connection terminals by forming a separation groove by eliminating a circumference portion of the metal substrate, disconnected with a center portion thereof by the insulation groove along the circumference with a predetermined gap; mounting or manufacturing an electronic part on the metal substrate or the oxide layer; and electrically connecting an electrode of the electronic part with the external connection terminal.

10 Claims, 24 Drawing Sheets

S64,S70

S20

TERMINAL-INTEGRATED METAL BASE PACKAGE MODULE AND TERMINAL-INTEGRATED METAL BASE PACKAGING METHOD

BACKGROUND OF THE INVENTION (a) Field of the Invention

The present invention relates to a terminal-integrated metal base package module and a terminal-integrated packaging method for a metal base package module. More particularly, the present invention relates to a terminal-integrated metal base package module that enables to easily manufacture a metal base package module that can be easily mounted and has low possibility in short-circuit or damage by utilizing a part of a metal substrate as an external connection terminal for connection with an external circuit, and a terminal-integrated package method for a metal base package module.

(b) Description of the Related Art

A packaging process in a semiconductor element manufacturing process protects a semiconductor chip from an external environment, shaping the semiconductor chip for convenient use, and increase reliability of the semiconductor element by protecting an operation function in the semiconductor chip.

As the degree of integration of semiconductor elements is increased and various functions are provided to the semiconductor elements, the packaging process tends to be changed from a process suitable for a small number of pins of a package to a process suitable for a large number of pins of the package. In addition, a conventional structure for mounting the package on a printed circuit board (PCB) has been replaced with a surface mounting structure. Many types of packages with the surface mounting structure have been proposed, for example a small outline package (SOP), a plastic leaded chip carrier (PLCC), a quad flat package (QFP), a ball grid array (BGA), and a chip scale package (CSP).

A base substrate used in a chip carrier or a printed circuit board (PCB) associated with the semiconductor element needs to have thermal, electrical, and mechanical stability. Conventionally, an expensive ceramic substrate or a resin substrate made of polyimide-based resin, fluoride-based resin, or silicon-based resin has been used as the base substrate for the chip carrier or the PCB. The ceramic substrate or the resin substrate are made of an insulation material so that coating of an insulation material is not required after a through hole process. However, the resin substrates are made of an expensive material and have poor water-resistance and heat-resistance so that it is not usable for a chip carrier substrate. Although the ceramic substrate has better heat resistance than that of the resin substrate, the ceramic substrate has problems in that the ceramic substrate is also expensive and hard to process, and has a high production cost.

In order to overcome such a drawback of the ceramic or resin substrate, use of a metallic substrate has been proposed. The metallic substrate metal material has merits in that it is inexpensive, easily processed, and has good thermal reliability. However, an insulation treatment that is not required in the resin or ceramic substrate should be additionally performed for the metallic substrate, and wire bonding is required to connect a part (e.g., photonic element, semiconductor chip, passive element, VOC, and the like) mounted on the substrate with an external circuit (e.g., driving circuit). Particularly, short-circuit, breakage, or damage may occur during the wire bonding.

The Korean Patent Nos. 10-0656295, 10-0656300, 10-0625196disclosed recently introduced and developed package module techniques using a metal substrate. The disclosed techniques complete a module including a semiconductor chip by forming an oxide layer in an inexpensive metal substrate and provide a package module having an excellent high-frequency characteristic semiconductor process comparability, high thermal reliability, and EMI and EMC stability.

In general, a completed semiconductor chip is completed again through a professional packaging company. A typical packaging process includes die bonding of a semiconductor chip to a lead frame through re-distribution of the semiconductor chip, wire bonding of an external terminal and the semiconductor chip, and protecting the lead frame and the semiconductor chip using an encapsulated molding compound (EMC) for protection of a final semiconductor chip. This is referred to as a back-end process. The back-end process costs 30% of the cost price of the completed semiconductor package, and requires equipment for rearranging the semiconductor chip to the lead frame and wire bonding equipment.

In order to reduce expenses for the back-end process and downsize the semiconductor chip, a wafer level packaging (WLP) technique has been developed and used. According to most of the WLP methods, a ball is formed in an electrode pad and connected with an external circuit using a flip-chip method, or a pad is formed and connected with the external circuit using wire bonding method. However, the flip-chip method is expensive packaging method and has problems of expensive equipment, reliability in the element, and throughput, so that package manufacturers tend to avoid the flip-chip method.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a terminal-integrated metal base package module that can prevent short-circuit or breakage by forming an oxide layer at the top side of a metal substrate, mounting an electronic part thereon, and utilizing a part of the circumference of the metal substrate as an external connection terminal for electrical connection with an external circuit.

In addition, the present invention provides a terminal-integrated package method for a metal base package module having a structure in which an oxide layer is formed on the top surface of the metal substrate and a part of the circumference of the metal substrate is insulated from the inside to utilize the part as an external connection terminal for connection with an external circuit so that a back-end process (die bonding, lead frame work, wire bonding work, and the like) generally used in the semiconductor packaging process can be omitted and the metal base package module can be directly formed on the external connection terminal, thereby remarkably reducing manufacturing cost.

In addition, the present invention provides a terminal-integrated package method for a metal base package module that newly suggests a system on lead frame structure that enables manufacturing of a metal base package module of which an element completed through the WLP method is formed through the lead frame method.

Further, the present invention provides a terminal-integrated package method for a metal base package module that can significantly reduce the area of a packaged chip by manufacturing a metal base package module of which an element completed through the WLP method is formed through the lead frame method, and increase productivity by directly applying the most widely used surface mounting technology.

A terminal-integrated metal base package module according to an exemplary embodiment of the present invention includes: a metal substrate formed with a conductive metal material; an oxide layer formed on the metal substrate; a plurality of external connection terminals formed by a remaining conductive metal material and arranged along an exterior circumference of the metal substrate with a distance therebetween; and an insulating layer formed with an insulation material to insulate the external connection terminal from other portion along the circumference of the metal substrate and simultaneously prevent short-circuit between the external connection terminals.

An electrode of an electronic part mounted or installed on the metal substrate or the oxide layer is electrically connected with the external connection terminal through wire bonding.

A terminal-integrated package method for a metal base package module according to an exemplary embodiment of the present invention includes: preparing a metal substrate formed with a conductive metal material; forming an oxide layer by oxidizing one side of the metal substrate to a predetermined depth; forming an insulation groove by partially eliminating the metal substrate to the oxide layer with a constant width along the circumference of the metal substrate from an opposite side of the metal substrate; forming a plurality of external connection terminals by forming a separation groove by eliminating a circumference portion of the metal substrate, disconnected with a center portion thereof by the insulation groove along the circumference with a predetermined gap; mounting or manufacturing an electronic part on the metal substrate or the oxide layer; and electrically connecting an electrode of the electronic part with the external connection terminal.

The terminal-integrated package method for the metal base package module according to the exemplary embodiment of the present invention may further include forming an insulating layer by filling an insulation material between the insulation groove and the plurality of external connection terminals after forming of the plurality of external connection terminals.

Further, the terminal-integrated package method for the metal base package module according to the exemplary embodiment of the present invention may further include molding using a molding material after the electrical connection.

An insulating layer may be formed in the molding process rather than additionally performing the process for forming the insulating layer.

According to the terminal-integrated metal base package module and the terminal-integrated package method for a metal base package module of the exemplary embodiments of the present invention, the external connection terminals are formed along the circumference of the metal substrate so that an external circuit (e.g., driving circuit) can be electrically connected directly using a ball grid array (BGA) or land grid array (LGA) method rather than performing wire bonding, and the module can be effectively mounted.

In addition, according to the terminal-integrated metal base package module and the terminal-integrated package method for a metal base package module of the exemplary embodiments of the present invention, excellent heat dissipation performance can be maintained by using the metal substrate.

When the terminal-integrated package method for a metal base package module according to the exemplary embodiment of the present invention is applied to the Korean Patent Nos. 10-0656295, 10-0656300, and 10-0625196, the circumference portion of the metal substrate is formed as the external connection terminal and thus the package is completed while simultaneously forming the module so that the manufacturing process can be effectively performed.

In addition, according to the terminal-integrated package method for a metal base package module of the exemplary embodiment of the present invention, the external connection terminal (lead frames) are completed through the WLP so that a system on lead frame is established as a new concept, manufacturing process time can be shortened by omitting a package process through a back-end process (die bonding, wire bonding, and the like) using another process at other location after the chip manufacturing process through a conventional semiconductor process, and manufacturing cost can be significantly reduced by completing the packaging in the shape of a lead frame in one process line, and the BGA or LGA type WLP having high throughput can be achieved through the stable semiconductor process.

According to the terminal-integrated package method for a metal base package module of the exemplary embodiment of the present invention, a lead frame-type package module completed through the WLP can be significantly reduced in size such that it can correspond to a standard tape and reel size, and accordingly the throughput speed and process cost can be remarkably reduced by applying a surface mount technology commonly used with low cost.

Further, when the terminal-integrated package method for a metal base package module according to exemplary embodiment of the present invention is applied to the Korean Patent No. 10-0656300 that relates to a method in which the semiconductor element is installed in the substrate and integrally connected thereto, the module can be completed without wire bonding so that a very thin module can be manufactured.

DETAILED DESCRIPTION OF THE EMBODIMENTS

Figure 1:
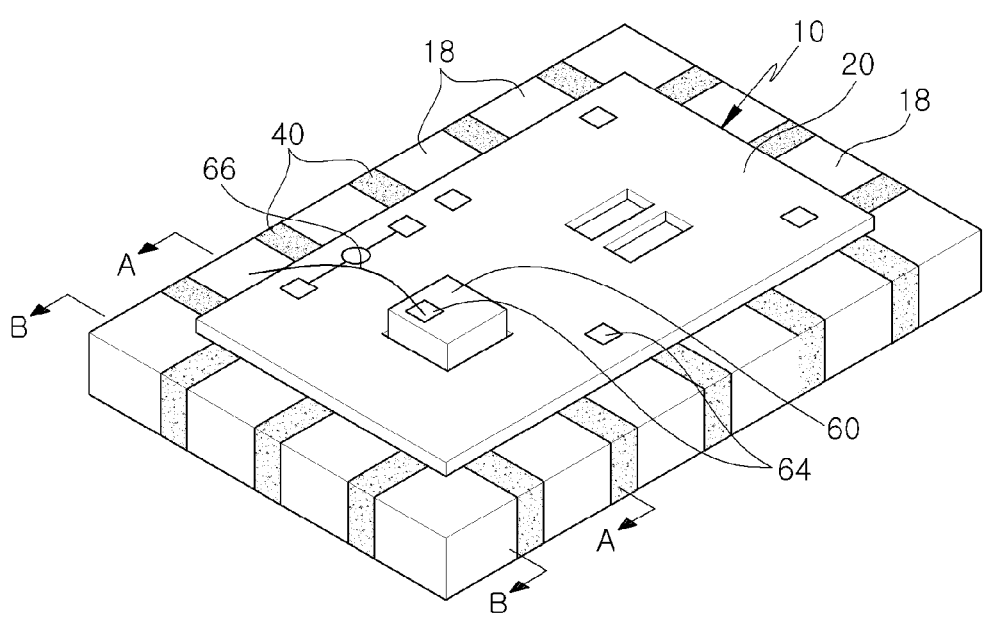
FIG. 1 is a plane perspective view of a terminal-integrated metal base package module according to a first exemplary embodiment of the present invention.
Figure 2:
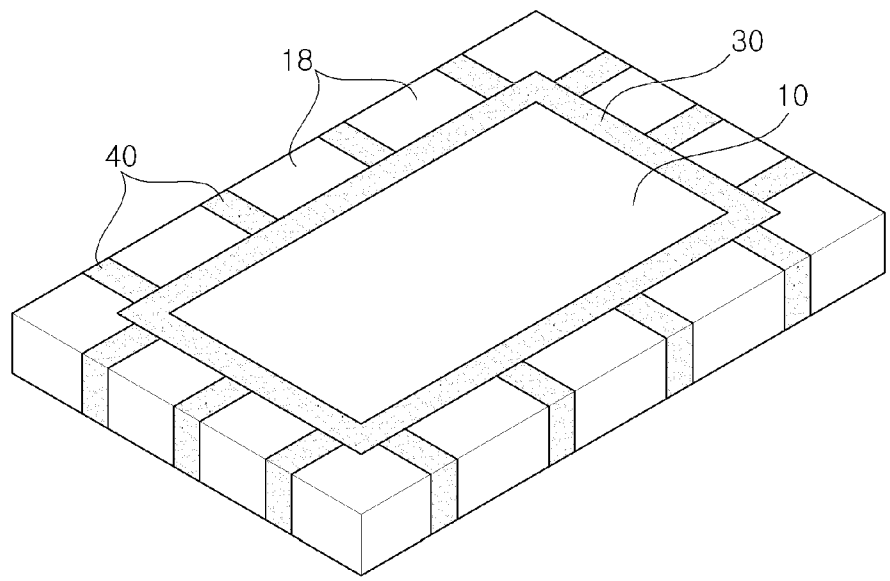
FIG. 2 is a bottom perspective view of the terminal-integrated metal base package module according to the first exemplary embodiment of the present invention.
Figure 3:
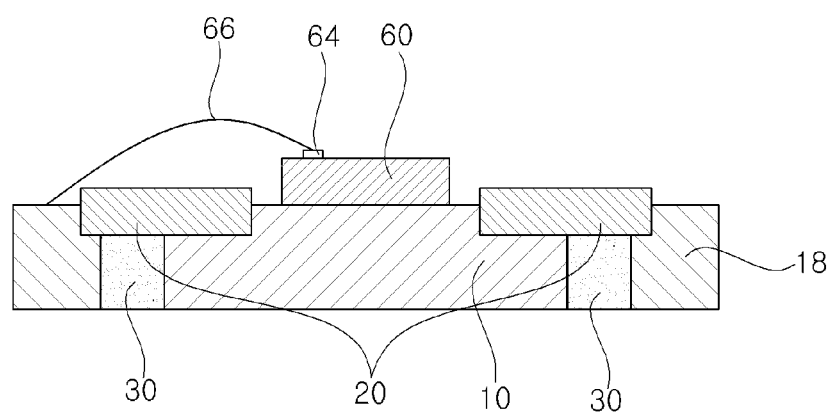
FIG. 3 is a cross-sectional view of FIG. 1, taken along the line A-A.
Figure 4:
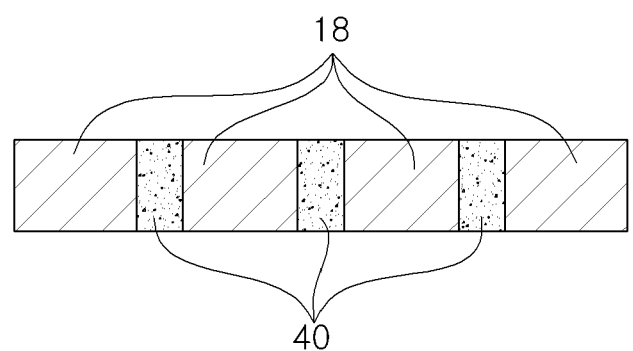
FIG. 4 is a cross-sectional view of FIG. 1, taken along the line B-B.

Preferred exemplary embodiments of a terminal-integrated metal base package module and a terminal-integrated package method for a metal base package module according to the present invention will now be described in further detail with reference to the accompanying drawings.

The exemplary embodiments of the present invention can be modified in various manners, and the present invent is not limited to the below-described exemplary embodiments. The exemplary embodiments of the present invention are provided so that the ordinarily skilled in the related art can understood the present invention. In the drawings, shapes of elements may be exemplified and exaggerated for the convenience of description. In the drawings, the same reference numerals denote the same elements, and the repeated description will be omitted.

A terminal-integrated metal base package module according to a first exemplary embodiment of the present invention is formed of a metal substrate 10 formed with a conductive metal material as shown in FIG. 1 to FIG. 4.

The material of the metal substrate 10 exemplarily includes aluminum (Al), magnesium (Mg), or titanium (Ti).

Preferably, the metal substrate 10 is formed in a small-sized thin type with sufficient strength while maintaining an excellent heat dissipation function.

For example, the thickness of the metal substrate 10 is about 0.1 to 5 mm, and preferably between 0.15 to 1.0 mm.

The metal substrate 10 may be formed in the shape of a plate or a wafer, and a printed circuit technique or a semiconductor process may be applied thereto.

An oxide layer 20 is formed on the metal substrate 10.

Excluding a portion where an electronic part 60 is mounted in the metal substrate 10, the oxide layer 20 is formed along the circumference of the metal substrate 10 and has a constant distance from each circumference of the metal substrate 10.

That is, the oxide layer 20 is formed at other portion than a portion where the electronic part 60 is mounted, and extends to a part of the external connection terminal 18 disposed close to an insulation groove 14.

The oxide layer 20 may be formed by applying an anodic oxidation method and the like.

When the electronic part 60 is directly mounted on the metal substrate 10 heat can be further effectively dissipated, and thus it is more effective to an electronic part 60 having a large heat dissipation amount.

The oxide layer 20 may be controlled to be formed in a place where it is required using a selective oxidization method.

When the metal substrate 10 is formed with aluminum, an aluminum oxide layer is formed as the oxide layer 20 through the anodizing.

The electron part 60 mounted on the metal substrate 10 exemplarily includes a photonic element, a semiconductor chip, a passive element, a PA, an LNA, a phase shifter, a mixer, an oscillator, a VCO, and the like.

An electrode formed with a conductive metal such as copper (Cu) or gold (Au) is formed on a top side of the electronic part 60.

Various methods used in the semiconductor process may be applied to mount the electronic part 60, and detailed descriptions for the methods will be omitted.

The electronic part 60 may be directly manufactured on the metal substrate 10.

Methods for forming the oxide layer 20 or mounting the electronic part 60 are not different from conventional methods, and therefore, forming of the oxide layer 20 and mounting or manufacturing of the electronic part 60 can be performed using various conventional methods and structures, and the conventional methods may be applied to the present invention. For example, Korean Patent Nos. 10-0656295, 10-0656300, and 10-0625196 may be applied to the exemplary embodiment of the present invention.

In addition, a plurality of external connection terminals are formed with a distance from each other along the outer circumference of the metal substrate 10 to thereby make a conductive metal material remained.

That is, the external connection terminals 18 are formed by a part of the metal substrate 10.

The external connection terminals 18 are insulated by insulating layers 30 and 40.

For example, the external connection terminals 18 are insulated from the inside of the metal substrate 10 by the insulating layers 30 formed along the whole circumference of the metal substrate 10, and short-circuit is prevented by the insulating layers 40 formed between the respective external connection terminals 18.

The insulating layers 30 and 40 are formed with an insulating material, that is, an insulator.

The insulating material forming the insulating layers 30 and 40 includes synthetic resin, silicon, oxide, ceramic, and the like.

The insulating layers 30 and 40 may be formed with an air layer that is remained empty rather than being filled with an insulating material as necessary. However, the mechanical stability can be further improved by forming the insulating layers 30 and 40.

The insulating layers 30 and 40 may form the oxide layer to be integrated to the metal substrate 10 if they can selectively form the oxide layer while effectively controlling the metal substrate 10 within a specific range.

In addition, an electrode 64 of the electronic part 60 mounted on the metal substrate 10 and the external connection terminals 18 are connected with each other through wire bonding 66.

In the case of the terminal-integrated metal base package module according to the exemplary embodiment of the present invention, a module installation process is completed by connecting an external circuit (e.g., a driving circuit) and the external connection terminals 18 so that the installation process can be easily performed. Particularly, the external connection terminals 18 and the external circuit can be connected by mounting the package module in the manner of a slot or attaching/detaching method so that the connection between the external connection terminal 18 and the external circuit can be easily performed.

Figure 5:
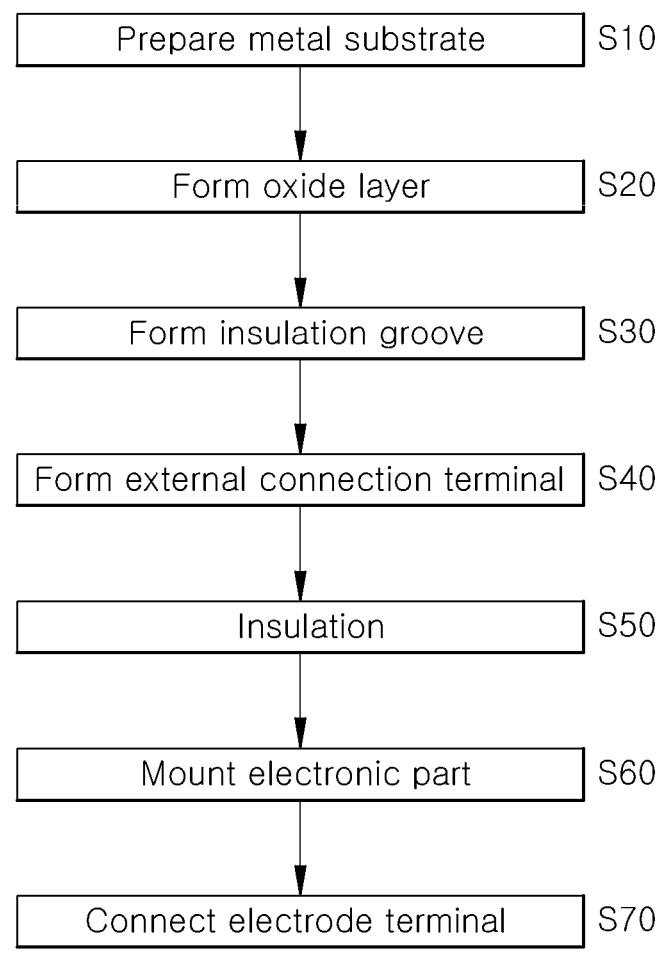
FIG. 5 is a block flowchart of a terminal-integrated packaging method for a metal base package module according to a second exemplary embodiment of the present invention.
Figure 6:
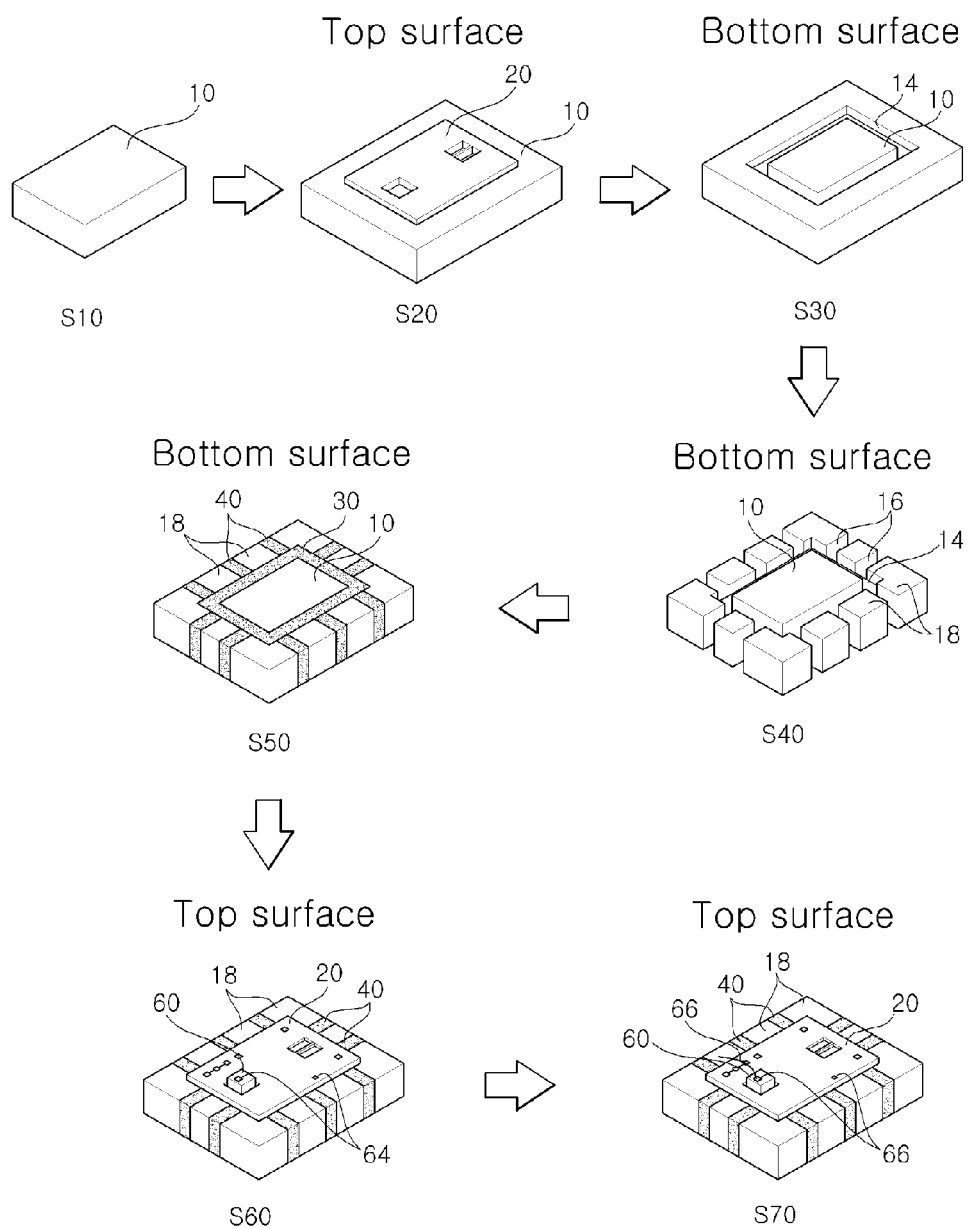
FIG. 6 is a process flowchart of the terminal-integrated packaging method for a metal base package module according to the second exemplary embodiment of the present invention.

A terminal-integrated packaging method for a metal base package module according to a second exemplary embodiment of the present invention will now be described with reference to FIG. 5 and FIG. 6.

First, a metal substrate 10 formed with a conductive metal material is prepared (S10).

Aluminum (Al), magnesium (Mg), titanium (Ti), and the like may be used as the metal substrate 10.

An oxide layer 20 is formed by oxidizing one side of the metal substrate 10 to a predetermined depth (S20).

When the oxide layer 20 is formed on the top surface of the metal substrate 10, it is preferred that an anti-oxidation mask pattern may be formed on the lower surface of the metal substrate 10 to prevent oxidation or a lower portion of the metal substrate 10 is protected by using other devices.

The thickness of the oxide layer 20 may correspond to the height of the electronic part 60 mounted on the metal substrate 10.

The oxide layer 20 is formed along the circumference of the metal substrate 10, excluding the part where the electronic part 60 is mounted, and is disposed with a predetermined distance from the end corner of the circumference of the metal substrate 10.

The oxide layer 20 may be formed through an anodic oxidation process.

When the metal substrate 10 is formed with an aluminum oxide layer is formed through the anodic oxidation process as the oxide layer 20.

An insulation groove 14 is formed from the opposite side (i.e., lower surface) of the metal substrate 10 along the circumference thereof to the oxide layer 20 with a predetermined width (S30).

The insulation groove 14 is formed with a depth while sufficiently eliminating the metal substrate 10 such that the insulation groove 14 contacts the inside of the oxide layer 20 without penetrating the oxide 20.

It is preferred to form the insulation groove 14 with a thickness that enables sufficient insulation when being filled with an insulation material. For example, the thickness of the insulation groove 14 may be formed in a range between 0.05 to 0.5 mm.

When the metal substrate 10 is used as a ground electrode, the insulation groove 14 is formed to connect at least one external connection terminal 18 with the metal substrate 10.

That is, the insulation groove 14 may be formed in the shape of the opened line having part where the circumference of metal substrate 10 is partially connected with the inside thereof disconnected rather than forming in the shape of a closed-curve line formed along the entire circumference of the metal substrate 10.

In addition, a separation groove 16 is formed be eliminating a circumference portion of the metal substrate 10 disconnected with a center portion thereof by the insulation groove 14 such that the external connection terminal 18 is formed in plural (S40).

That is, the external connection terminals 18 are arranged, interposing the separation groove 16 formed by partially cutting out the circumference of the metal substrate 10.

In the above description, the insulation groove 14 and the separation groove 16 are formed through two steps, but they may be simultaneously formed.

For example, the insulation groove 14 and the separation groove 16 may be simultaneously formed through one etching process after patterning the insulation groove 14 and the separation groove 16 at the bottom side of the metal substrate 10. Particularly, when a highly selective chemical etching characteristic is used between a metallic material and a metal oxide, a metal that is not patterned is etched and the metal oxide is not etched so that the insulation groove 14 and the separation groove 16 can be simultaneously formed with ease.

The insulation groove 14 and the separation 16 may be formed using a dry etching process or a mechanical processing method rather than the chemical etching process.

The insulation groove 14 and the separation groove 16 preferably have a thickness for sufficient insulation when the insulation material is filled therein. For example, the insulation groove 14 and the separation groove 16 may respectively have a thickness between 0.05 to 0.5 mm.

The thickness of the insulation groove 14 and the thickness of the separation groove 16 may be larger than 0.5 mm as necessary. For example, the thickness of the insulation groove 14 and the thickness of the separation groove 16 may vary rather than limited to the above-stated range for sufficient space and processing. For insulation, the insulation groove 14 and the separation groove 16 may respectively have a thickness smaller than the above-stated range.

The insulation groove 14 and the separation groove 16 are filled with an insulation material such that the insulating layers 30 and 40 are formed (S50).

An insulation material such as synthetic resin, silicon, or ceramic may be used as the insulation material.

The insulating layers 30 and 40 may be formed with an empty air layer rather than being filled with the insulation material as necessary.

In the metal substrate 10, the electronic part 60 is mounted on a portion where the oxide layer 20 is not formed (S60).

The electrode 64 of the electronic part 60 is electrically connected with the corresponding external connection terminal 18 (S70).

As the electronic part 60, a photonic element, a semiconductor chip, a passive element, a PA, an LNA, or a phase shifter may be used.

The electrode 64 is disposed at an upper portion of the electronic part 60, and the external connection terminal 18 corresponding to the electrode 64 are electrically connected with using wire bonding 66.

Figure 7:
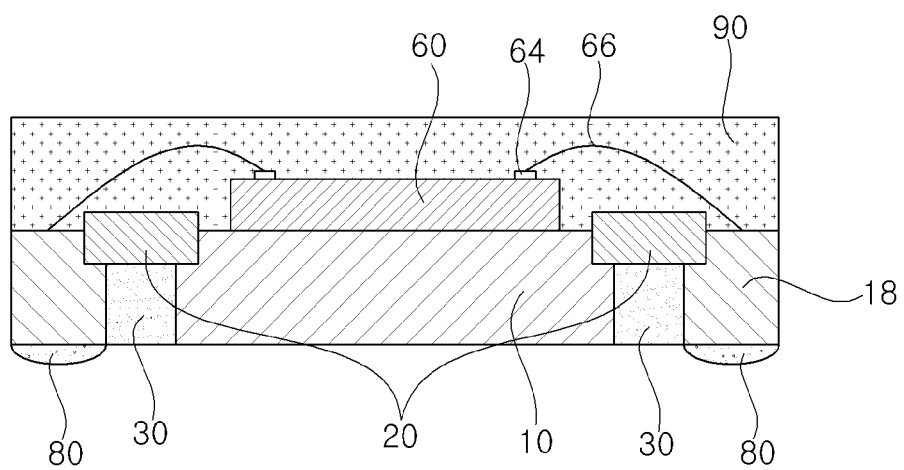
FIG. 7 is a cross-sectional view of a terminal-integrated metal base package module according to a third exemplary embodiment of the present invention, corresponding to FIG. 3.

As shown in FIG. 7, a terminal-integrated metal base package module according to a third exemplary embodiment of the present invention has a structure in which an electronic part 60 is directly mounted on a metal substrate 10, an oxide layer 20 is formed at the periphery of an insulation groove 14 to prevent the metal substrate 10 and external connection terminals 18 from being short-circuited, an electrode 64 of the electronic part 60 and the external connection terminal 18 are connected using wire bonding 66, and a molding layer 90 is formed to protect the electronic part 60 and the wire bonding 66 using a molding material (e.g., encapsulated molding compound (EMPC)).

The molding layer 90 may be formed throughout the entire surface of the metal substrate 10, and may be formed to partially surround the electronic part 60 and the wire bonding 66.

As necessary, a protection layer may be formed using various methods including covering a metal cap, a ceramic cap, or a plastic cap thereon rather than forming the molding layer 90 using the molding material. For example, a phosphor may be coated and simultaneously a circuit may be protected using silicon for an LED.

An adhesive pad 80 is provided in the external connection terminal 18 for adhering BGA or LGA. The adhesive pad 80 is formed at the bottom side of the external connection terminal 18, and may be formed with a conductive adhesive material.

Figure 8:
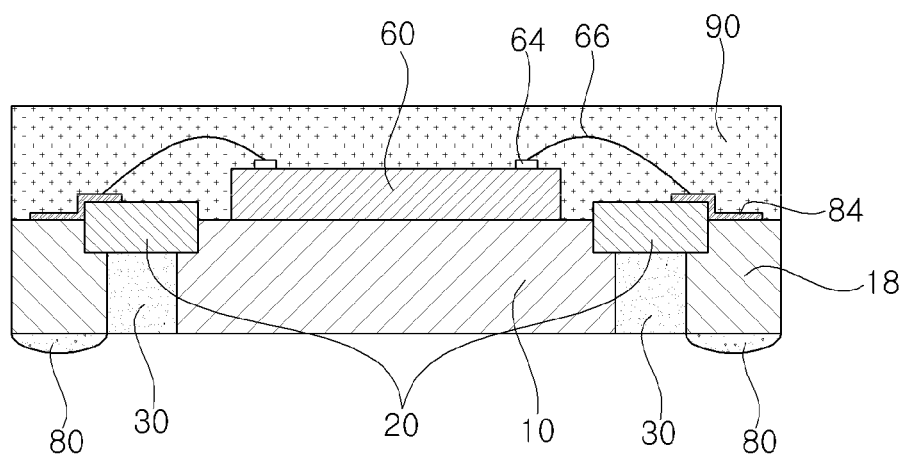
FIG. 8 is a cross-sectional view of a terminal-integrated metal base package module according to a fourth exemplary embodiment of the present invention, corresponding to FIG. 3.

As shown in FIG. 8, a terminal-integrated metal base package module according to a fourth exemplary embodiment of the present invention has a structure in which an external wiring 84 is formed on an external connection terminal 18 and an oxide layer 20 and the external wire 84 and an electrode 64 of an electronic part 60 are connected using wire bonding 66.

The external wiring 84 may be formed using a silkscreen method and the like.

Thus, the electronic part 60 is electrically connected with the external connection terminals 18 through the external wiring 84.

Figure 9:
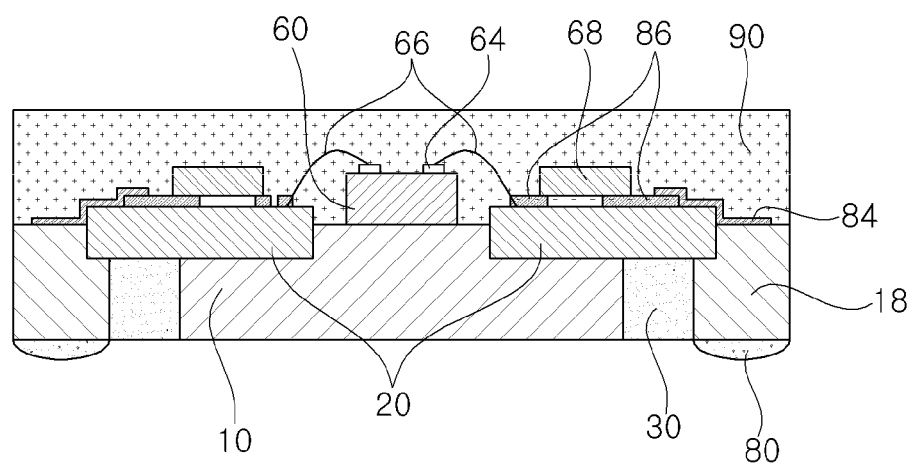
FIG. 9 is a cross-sectional view of a terminal-integrated metal base package module according to a fifth exemplary embodiment of the present invention, corresponding to FIG. 3.

As shown in FIG. 9, a terminal-integrated metal base package module according to a fifth exemplary embodiment of the present invention has a structure in which an internal wiring 86 or a passive element 68 is formed on an oxide layer 20, an electrode 64 of an electronic part 60 and the internal wiring 86 are connected through wire bonding 66, and an external wiring 84 is formed on the oxide layer 20 and the external connection terminal 18 for connection with the internal wiring 86.

The internal wiring 86 or the passive element 68 may be formed using a silkscreen method or a thick film process.

The passive element 68 may be formed with a surface mount device (SMD).

With such a configuration, the electronic part 60 is electrically connected with the external connection terminal 18 through the internal wiring 86 and the external wiring 84.

A package module having various functions can be variously formed as necessary by applying the terminal-integrated metal base package module according to the exemplary embodiment of the present invention.

Figure 10:
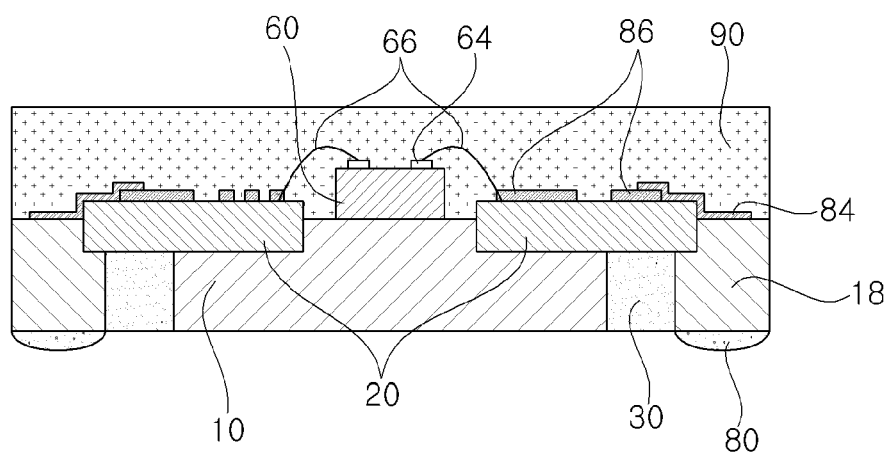
FIG. 10 is a cross-sectional view of a terminal-integrated metal base package module according to a sixth exemplary embodiment of the present invention, corresponding to FIG. 3.
Figure 11:
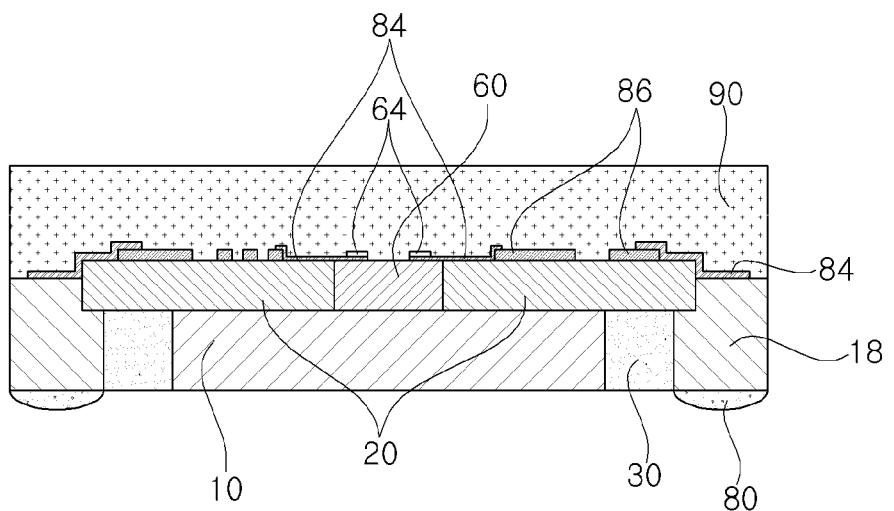
FIG. 11 is a cross-sectional view of a terminal-integrated metal base package module according to a seventh exemplary embodiment of the present invention, corresponding to FIG. 3.
Figure 12:
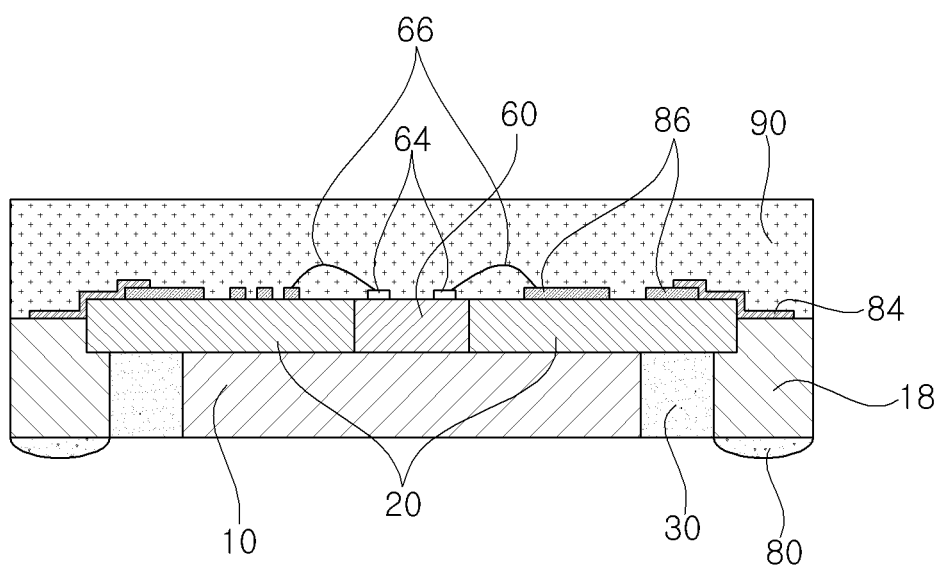
FIG. 12 is a cross-sectional view of a terminal-integrated metal base package module according to an eighth exemplary embodiment of the present invention, corresponding to FIG. 3.

For example, like terminal-integrated metal base package modules according to sixth to eight exemplary embodiments of the present invention shown in FIG. 10 to FIG. 12, the terminal-integrated metal base package module may be applied to the package module disclosed in the Korean Patent Nos. 10-0656295, 10-0656300, and 10-0625196.

The third to eighth exemplary embodiments respectively have the same structure of that of the first exemplary embodiment, excluding the above-stated structure, and therefore no further description will be provided.

As the manufacturing process of the third to eight exemplary embodiments of the present invention, a terminal-integrated package method for a metal base package module according to an exemplary embodiment to the present invention will now be described with reference to the drawings.

Figure 13:
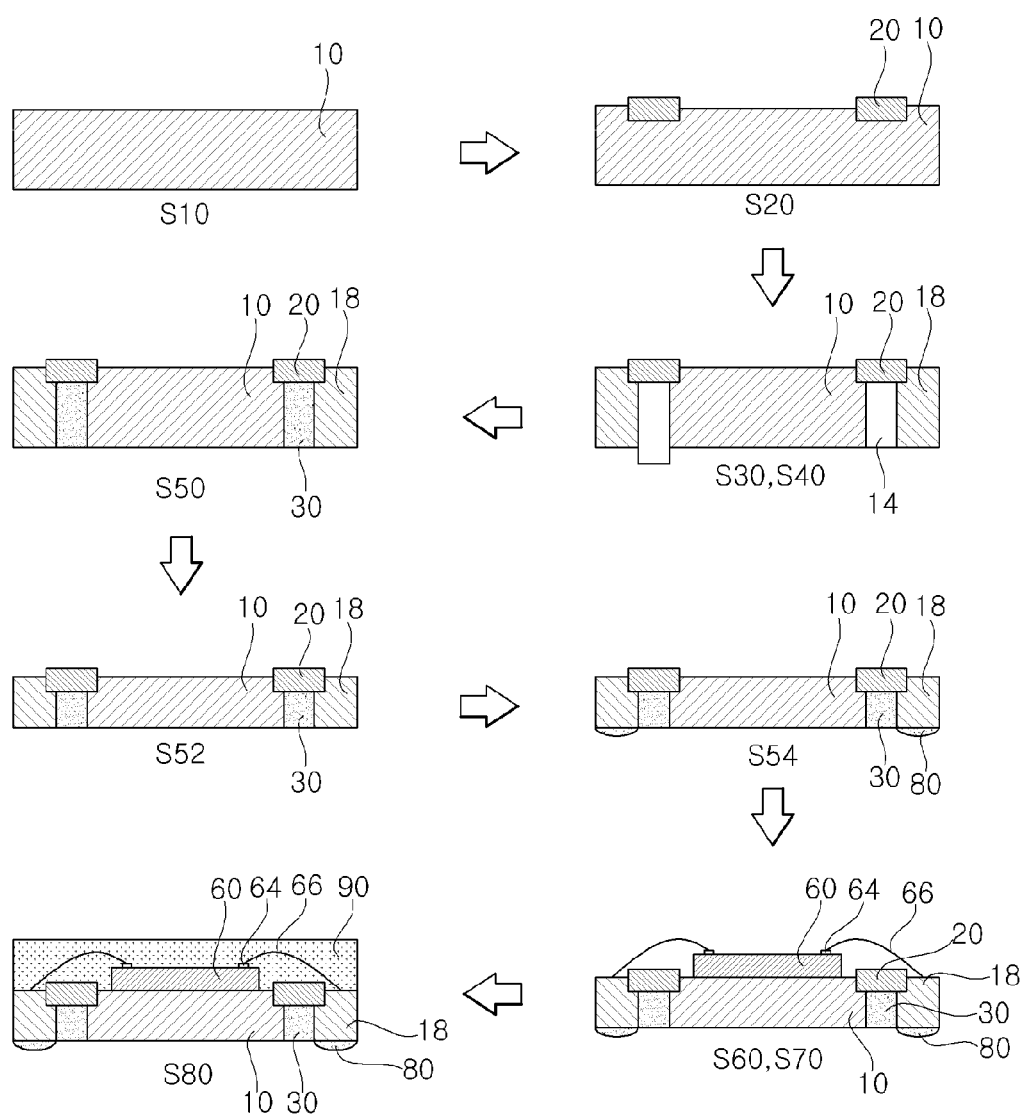
FIG. 13 is a process view of a terminal-integrated package method for a metal base package module of a ninth exemplary embodiment of the present invention, illustrating a process for manufacturing the terminal-integrated metal base package module according to the third exemplary embodiment of the present invention.

As shown in FIG. 13, a terminal-integrated package method for a metal base package module according to a ninth exemplary embodiment of the present invention includes: preparing a metal substrate 10 formed with a conductive metal material (S10); forming an oxide layer 20 at one side of the metal substrate 10 (S20); forming external connection terminals 18 by forming an insulation groove 14 and a separation groove 16 with a constant width along the circumference of the metal substrate 10 at the opposite side (i.e., bottom side) thereof (S30 and S40); forming insulating layers 30 and 40 by filling the insulation groove 14 and the separation groove 16 with an insulation material (S50); mounting an electronic part 60 on the oxide layer 20 (S60); connecting an electrode 64 of the electronic part 60 with the corresponding external connection terminal 18 through wire bonding 66 (S70); and forming a molding layer 90 by molding the electronic part 60 and the wire bonding 66 (S80).

After the forming (S50) of the insulating layers 30 and 40, grinding and lapping may be performed with a desired height on the lower side (i.e., bottom side) of the metal substrate 10 (S52), and an adhesive pad 80 may be formed in the external connection terminal 18 for adhering BGA or LGA (S54), and then the electronic part 60 may be mounted (S60).

The lapping may be selectively performed.

When the grinding and the lapping are performed on the bottom side of the metal substrate 10, a surface treatment process is preferably also performed on side of the metal substrate 10 for effective soldering of a solder ball or a mother board, to thereby improve productivity and increase reliability.

In the forming of the oxide layer 20 (S20), a selective anodic oxidation process is performed in order to prevent the oxide layer 20 is formed on a portion for installation of the electronic part 60.

In the forming of the molding layer 90 (S80), a protection layer that protects an upper portion may be formed through a process for coving a cap rather than forming the molding layer 90 using a molding material.

Figure 14:
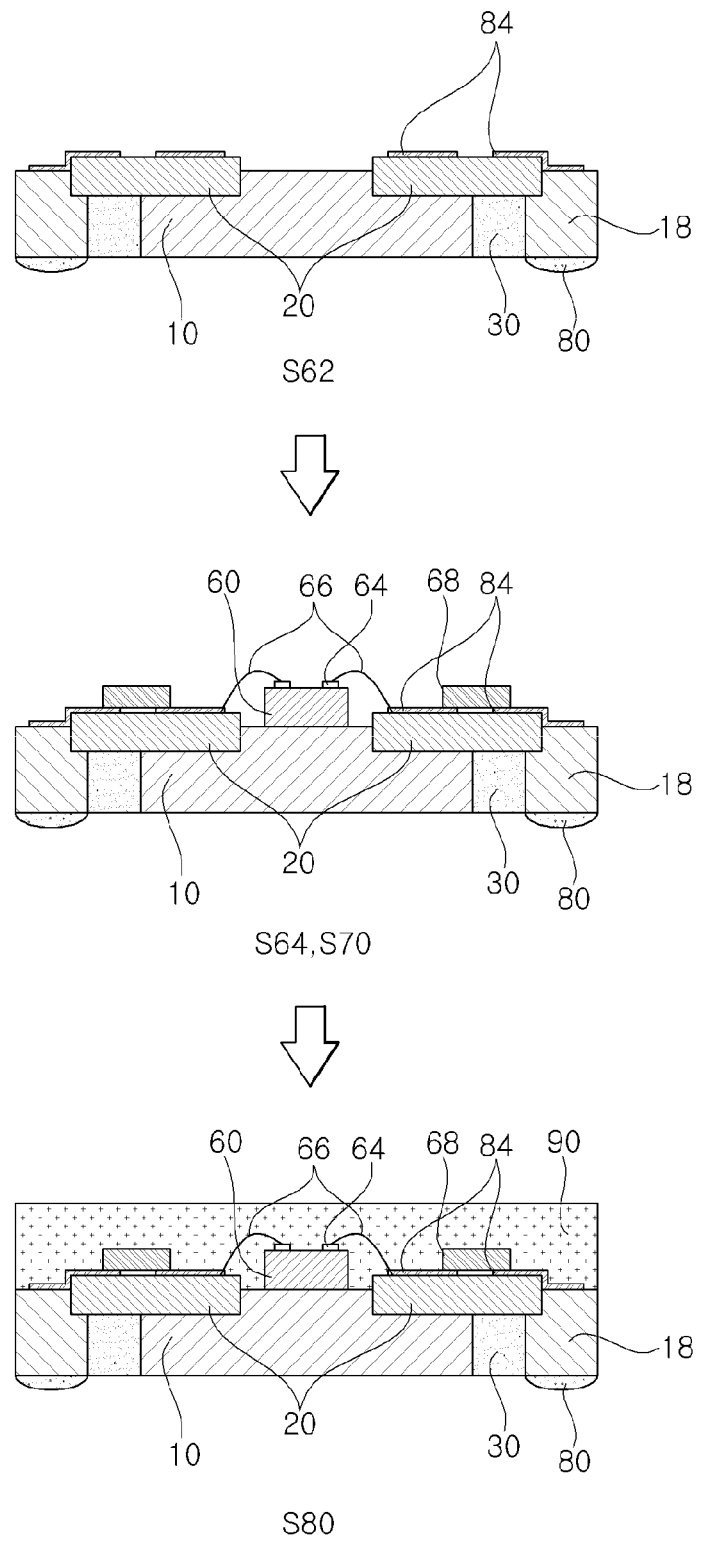
FIG. 14 is a process view of a terminal-integrated package method for a metal base package module of a tenth exemplary embodiment of the present invention, illustrating a process for manufacturing the terminal-integrated metal base package module according to the fifth exemplary embodiment of the present invention.

As shown in FIG. 14, a terminal-integrated package method for a metal base package module according to a tenth exemplary embodiment of the present invention, in the case of the terminal-integrated metal base package module according to the fifth exemplary embodiment (refer to FIG. 9), includes: forming an adhesive pad 80 for adhering BGA or LPG to an external connection terminal 18 (S54); forming an external wiring 84 and an internal wiring 86 using a silkscreen method and the like on an oxide layer 20 and the external connection terminal 18 (62); mounting an electronic part 60 and a passive element 68 (S64); connecting an electrode 64 of the electronic part 60 and the internal wiring 86 through wire bonding 66 (S70); and molding the electronic part 60, the passive element 68, and the wire bonding 66 with a molding layer 90 (S80).

In the forming of the molding layer 90 (S80), a protection layer that protects an upper portion may be formed through a process for coving a cap rather than forming the molding layer 90 using a molding material. In other exemplary embodiments, a protection layer that covers a cap rather than the molding layer 90 may be formed.

Figure 15:
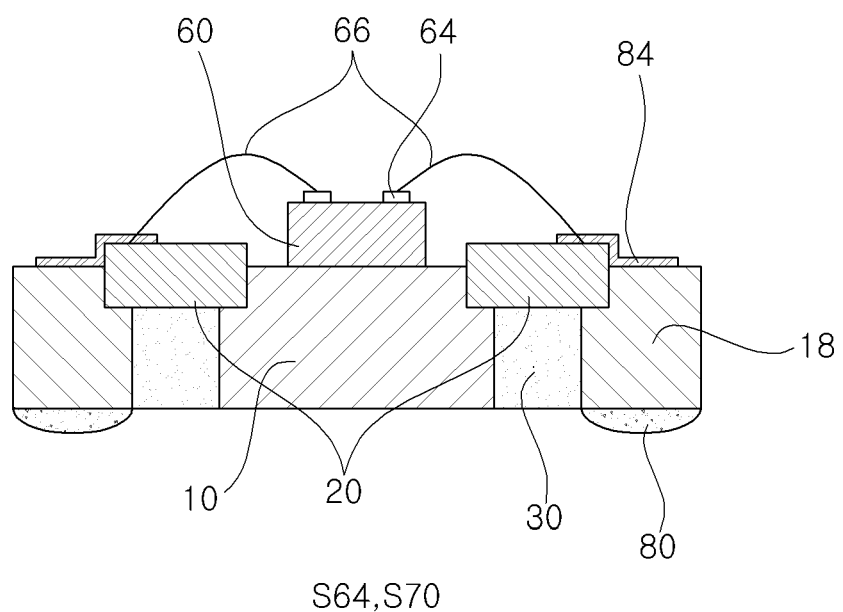
FIG. 15 is a cross-sectional view of the state that an electronic part is being mounted in a terminal-integrated package method for a metal base package module according to an eleventh exemplary embodiment of the present invention, illustrating the process for manufacturing the terminal-integrated metal base package module according to the fourth exemplary embodiment of the present invention, corresponding to FIG. 1.

As shown in FIG. 15, a terminal-integrated package method for a metal base package module according to a eleventh exemplary embodiment of the present invention, in the case of the terminal-integrated metal base package module according to the fourth exemplary embodiment of the present invention (refer to FIG. 8), is the same as the package method according to the tenth exemplary embodiment, excluding that an electronic part 60 is mounted (S64) and an electrode 64 of the electronic part 60 and an external wiring 84 are directly connected through wire bonding 66 (S70).

Figure 16:
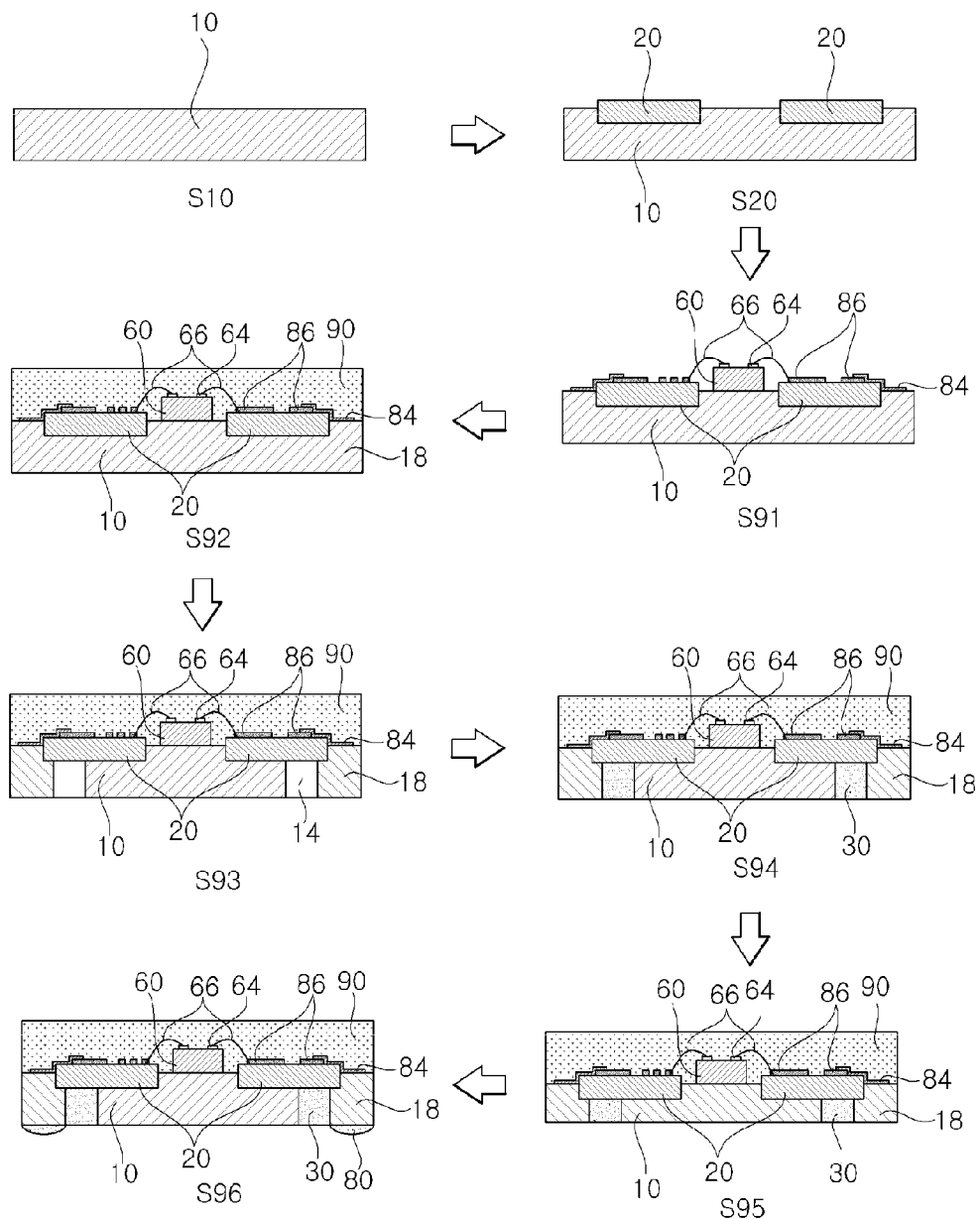
FIG. 16 is a process diagram of a terminal-integrated package method for a metal base package module according to a twelfth exemplary embodiment of the present invention, illustrating the process for manufacturing the terminal-integrated metal base package module according to the seventh exemplary embodiment of the present invention.

Further, as shown in FIG. 10 to FIG. 12, when the terminal-integrated metal base package module according to the present invention is applied to the package modules disclosed in the Korea Patent No. 10-0656295, 10-0656300, and 10-0625196, a terminal-integrated package method for a metal base package module according to an eleventh exemplary embodiment of the present invention shown in FIG. 16 may be manufactured.

For example, as shown in FIG. 16, in the case of the terminal-integrated metal base package module of the seventh exemplary embodiment of the present invention, a terminal-integrated package method for a metal base package module according to a twelfth exemplary embodiment of the present invention includes: preparing a metal substrate 10 formed with a conductive metal material (S10); forming an oxide layer 20 at one side of the metal substrate 10 (S20); forming a passive element 68 (e.g., a register, an inductor, a capacitor, a transmission line, and the like), an external wiring 84, and an internal wiring 86 using a semiconductor thin film process or as silkscreen process, mounting an electronic part 60, and connecting an electrode 64 of the electronic part 60 with the corresponding internal wiring 86 through wire bonding 66 (S91); forming a molding layer 90 by molding the electronic part 60, the wire bonding 66, the external wiring 84, and the internal wiring 86 (S92); forming external connection terminals 18 by forming an insulation groove 14 and a separation groove 16 to the oxide layer 20 with a constant width along the circumference of the metal substrate 10 at the opposite side (i.e., bottom side) of the metal substrate 10 (S93); forming insulating layers 30 and 40 by filling the insulation groove 14 and the separation groove 16 with an insulation material (S94); performing grinding and lapping with a desired height on the lower side (i.e., bottom side) of the metal substrate 10 (S95); and forming an adhesive pad 80 in the external connection terminal 18 for adhering the BGA or LGA (S96).

In the forming of the molding layer 90 (S92), a molding treatment for forming a protection layer that protects an upper portion may be formed through a process for coving a cap rather than forming the molding layer 90 using a molding material may be performed.

All the above-stated processes may be realized through a semiconductor manufacturing process or a silkscreen process.

In the terminal-integrated metal base package module according to the fifth exemplary embodiment of the present invention shown in FIG. 9, a system such as the electronic part 60 and the passive element 68 (e.g., a resistor, a capacitor, an inductor, a transmission line, and the like) is formed and mounted on the metal substrate 10, a protection layer protecting an upper portion of the metal substrate 10 by molding or covering a cap, and then the external connection terminals 18 may be formed. That is, the terminal-integrated package method for the metal base package module according to the twelfth exemplary embodiment of the present invention may be applied. In this case, the package is completed on the same process stage, and therefore the process efficiency can be improved and cost can be reduced compared to the case that the external connection terminal is installed after being formed.

According to the terminal-integrated metal base package module and the terminal-integrated package method for the metal base package module according to the exemplary embodiments of the present invention, the system can be formed on the metal substrate 10 through a semiconductor process and the external connection terminals 18 can be formed through the semiconductor process so that a water level packaging (WLP) can be realized in the shape of a lead frame rather than an existing flip chip ball forming process. That is, a semiconductor chip may be packaged using a system on lead frame method.

For example, as shown in FIG. 11, the system can be completed without using wire bonding and the package module in the shape of a lead frame is completed through the semiconductor process so that a very thin package module can be manufactured. Further, no wire bonding is required, the reliability can be increase and the manufacturing cost can be significantly reduced. In addition, since the thickness of the package can be realized to be the same as the thickness of the SMD, a packaged chip may be assembled to the entire mother board using equipment for SMD installation.

Figure 17:
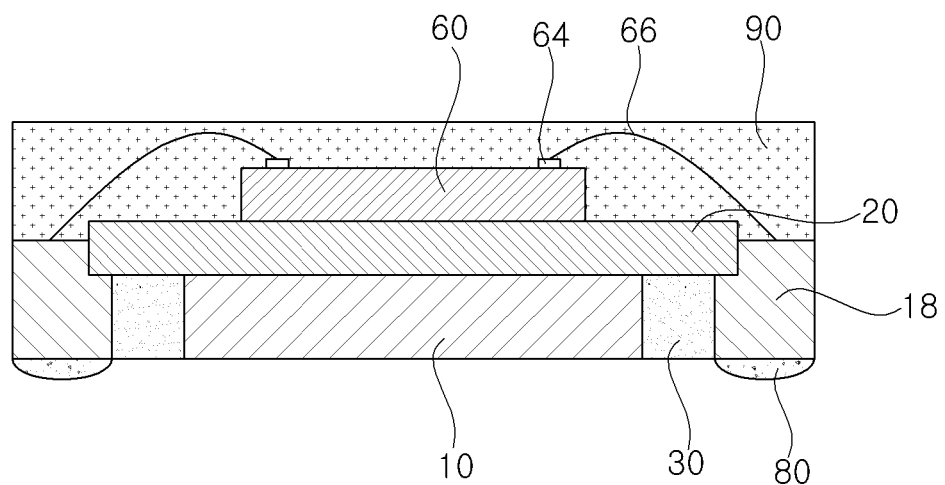
FIG. 17 is a cross-sectional view of a terminal-integrated metal base package module according to a thirteenth exemplary embodiment of the present invention, corresponding to FIG. 3.

As shown in FIG. 17, a terminal-integrated metal base package module according to a thirteenth exemplary embodiment of the present invention has a structure in which an electronic part 60 is installed on an oxide layer 20, an electrode 64 of the electronic part 60 and an external connection terminal 18 are connected through wire bonding 66, and a molding layer 90 for protecting the electronic part 60 and the wire bonding 66 using a molding material (e.g., an encapsulated molding compound (EMC)).

Instead of forming the molding layer 90 using the molding material, a protection layer for protecting an upper portion of the metal substrate 10 may be formed using a metal cap, a plastic cap, a ceramic cap, and the like.

Figure 18:
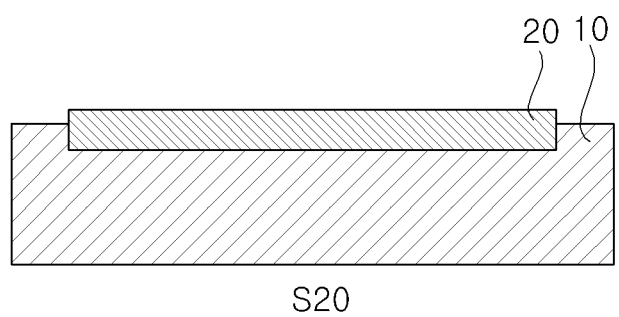
FIG. 18 is a cross-sectional view of the state that an oxide layer is formed during a process for manufacturing the terminal-integrated metal base package module according to the thirteenth exemplary embodiment of the present invention.

As shown in FIG. 18, a thirteenth exemplary embodiment is the same as the third exemplary embodiment, excluding that an oxide layer 20 is formed to a portion for installing of an electronic part 60 in forming of the oxide layer (S20).

Figure 19:
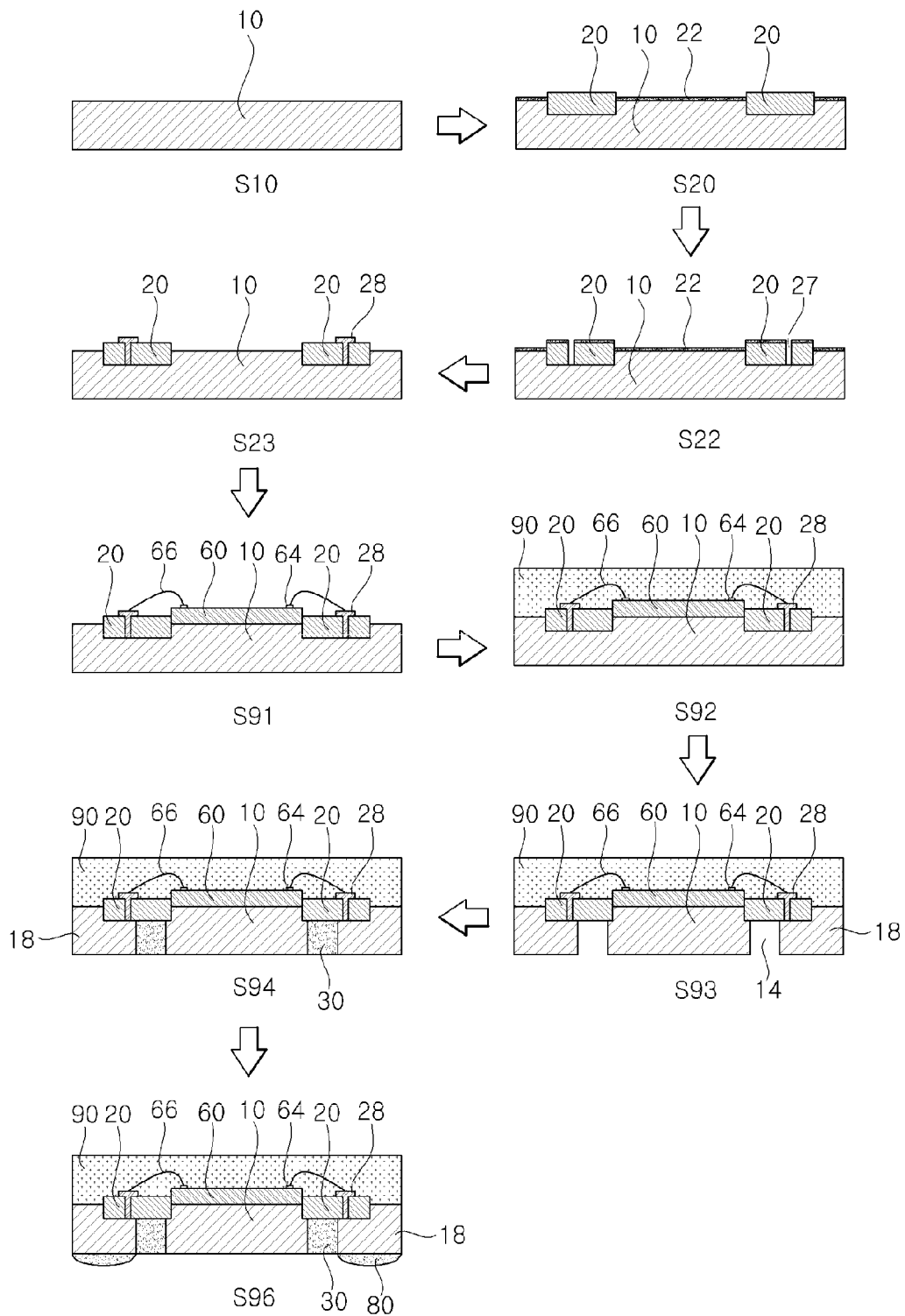
FIG. 19 is a process diagram of a terminal-integrated package method for a metal base package module according to a fourteenth exemplary embodiment of the present invention.

As shown in FIG. 19, a terminal-integrated package method for a metal base package module according to a fourteenth exemplary embodiment of the present invention includes: preparing a metal substrate formed with a conductive metal material (S10); forming an oxide layer 20 by forming selective anodizing oxidation after forming a masking pattern 22 at one side of the metal substrate 10 (S20); forming a via hole 27 through chemical etching in the oxide layer 20 (S22); forming a via electrode 28 by filling a conductive material in the via hole 27 (S23); mounting an electronic part 60 and connecting an electrode 64 of the electronic part 60 with the corresponding via electrode 28 through wire bonding 66 (S91); forming a molding layer 90 by molding the electronic part 60 and the wire bonding 66 (S92); forming external connection terminals 18 by forming an insulation groove 18 and a separation groove 14 with a constant width to the oxide layer 20 along the circumference of the metal substrate 10 from the opposite side (i.e., bottom side) of the metal substrate 10 (S93); forming insulating layers 30 and 40 by filling the insulation groove 14 and the separation groove 16 with an insulation material; and forming an adhesive pad 80 in the external connection terminal 18 for adhering the BGA or LGA (S96).

The sequence of the above-stated processes may be changed. That is, the forming of the external connection terminals 18 (S93) and the forming of the insulating layers 30 and 40 (S94) may be performed first and then the mounting of the electronic part 60 and connecting through the wire bonding (S91) and the forming of the molding layer 90 (S92) may be performed later.

In addition, the insulating layers 30 and 40 may not be formed as necessary.

As described, when the via electrode 28 is formed in the oxide layer 20 and the external connection terminal 18 and the electronic part 60 are electrically connected through the via electrode 28, the size of the entire module can be further reduced compared to the case using the external wiring 84 for the connection.

Figure 20:
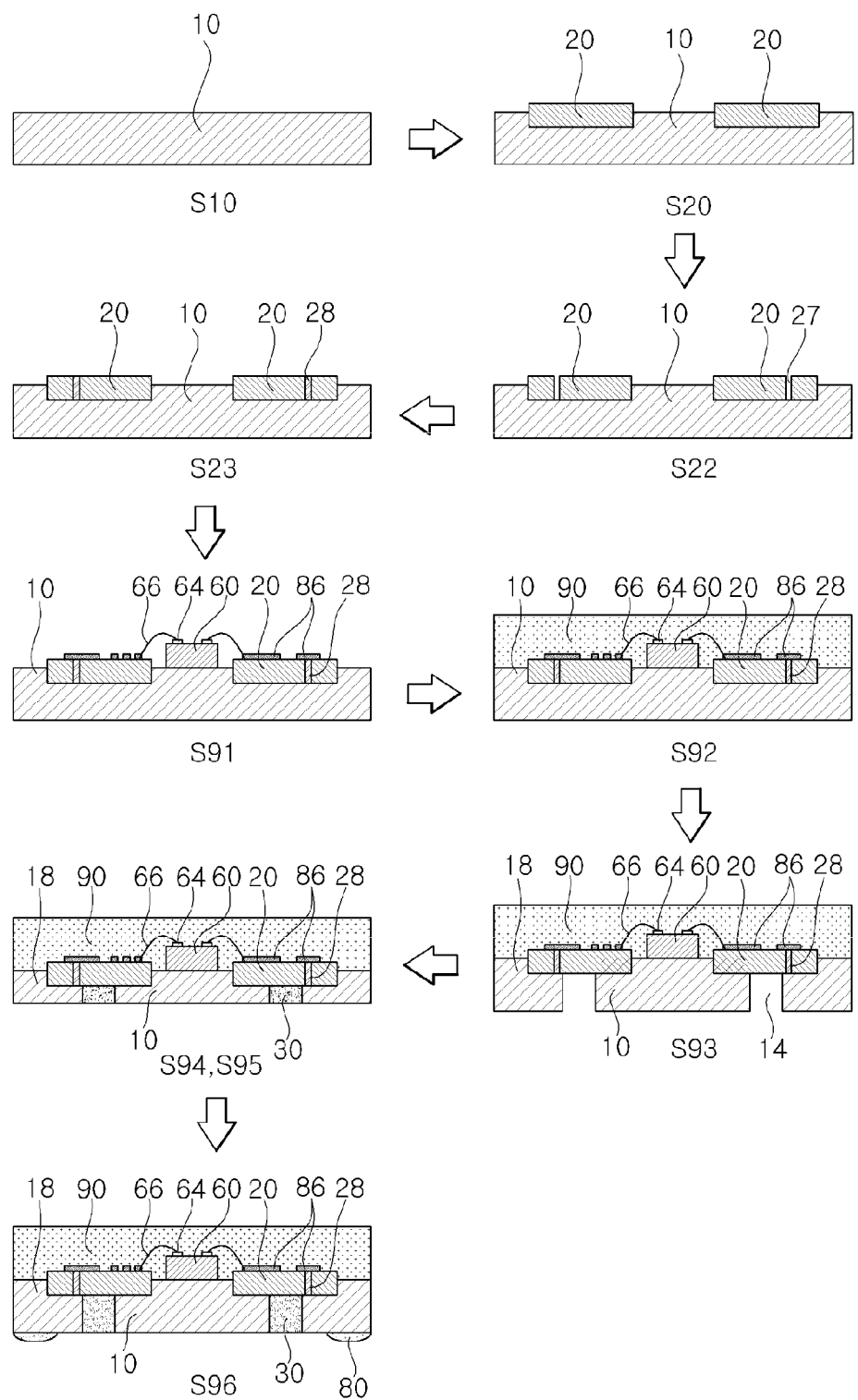
FIG. 20 is a process diagram of a terminal-integrated package method for a metal base package module according to a fifteenth exemplary embodiment of the present invention.
Figure 21:
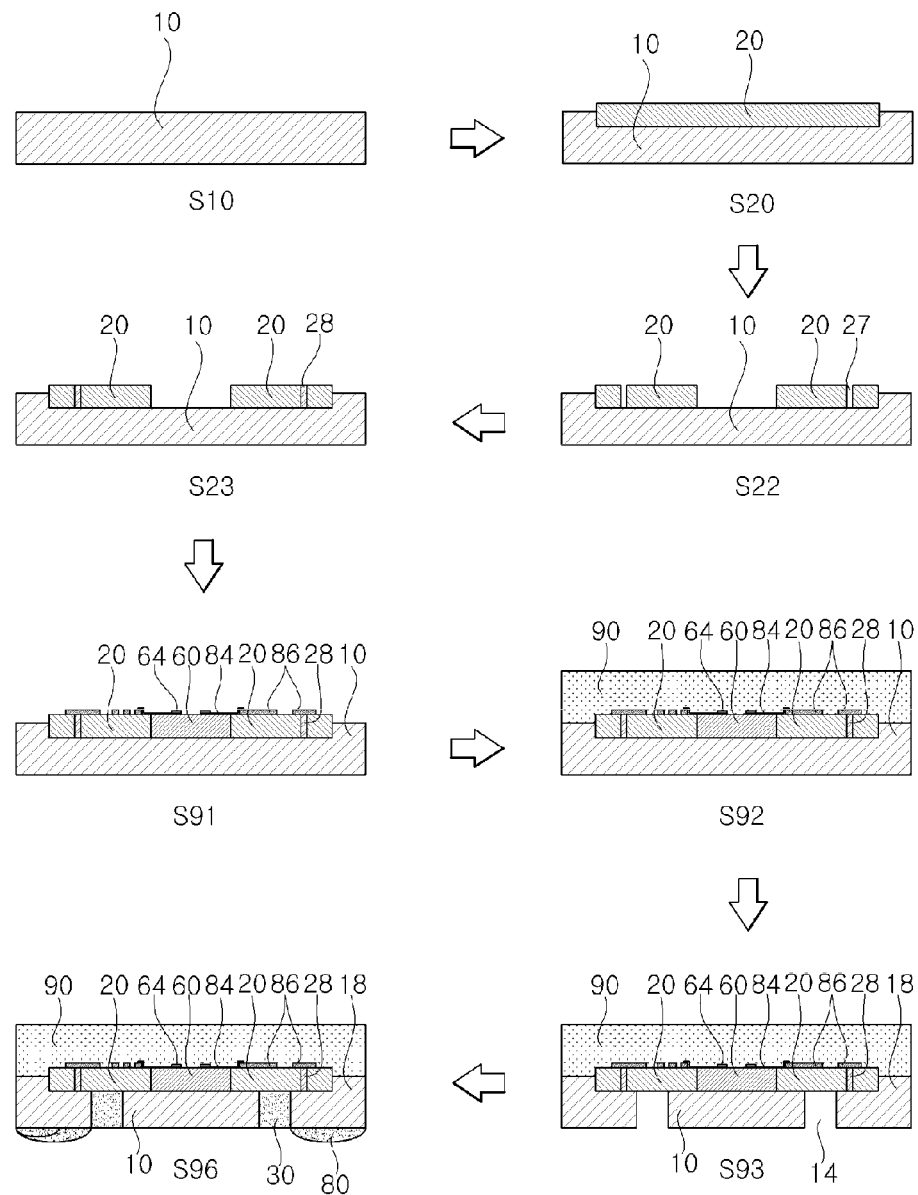
FIG. 21 is a process diagram of a terminal-integrated package method for a metal base package module according to a sixteenth exemplary embodiment of the present invention.

FIG. 20 and FIG. 21 illustrate terminal-integrated package methods for a metal base package module according to a fifteenth exemplary embodiment of the present invention and a sixteenth exemplary embodiment of the present invention. The fifteenth and sixteenth exemplary embodiments of the present invention are realized by applying the terminal-integrated package method for the metal base package module according to the fourteenth exemplary embodiment of the present invention respectively to the Korean Patent Nos. 10-0656295 and 10-0656300.

Figure 22:
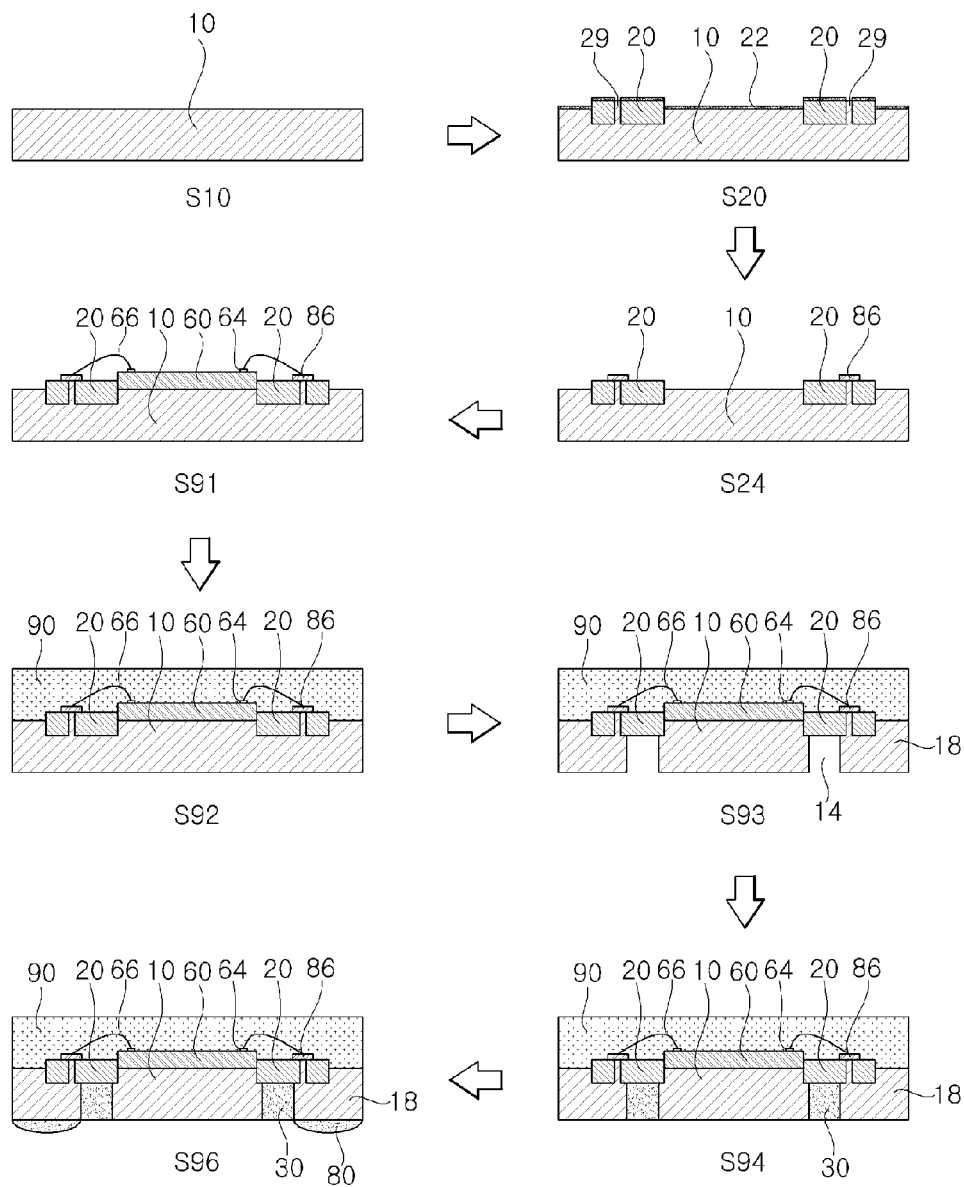
FIG. 22 is a process diagram of a terminal-integrated package method for a metal base package module according to a seventeenth exemplary embodiment of the present invention.

In addition, as shown in FIG. 22, a terminal-integrated package method for a metal base package module according to a seventeenth exemplary embodiment of the present invention includes forming a via electrode 29 directly in an oxide layer 20 by not oxidizing a part of the metal substrate 10, located at a portion where an external connection terminal 18 is to be formed in a process (S20) during which selective anodizing oxidation is performed for forming the oxide layer 20, and an internal wiring 86 formed at the top side of the via electrode 29 is connected an electrode of an electronic part 60 through wire bonding 66.

In this way, the via electrode 29 connected to the external connection terminal 18 is formed simultaneously during the process (S20) for forming the oxide layer 20 so that the via electrode 29 can be very simply formed, and the package manufacturing cost can be significantly reduced.

Figure 23:
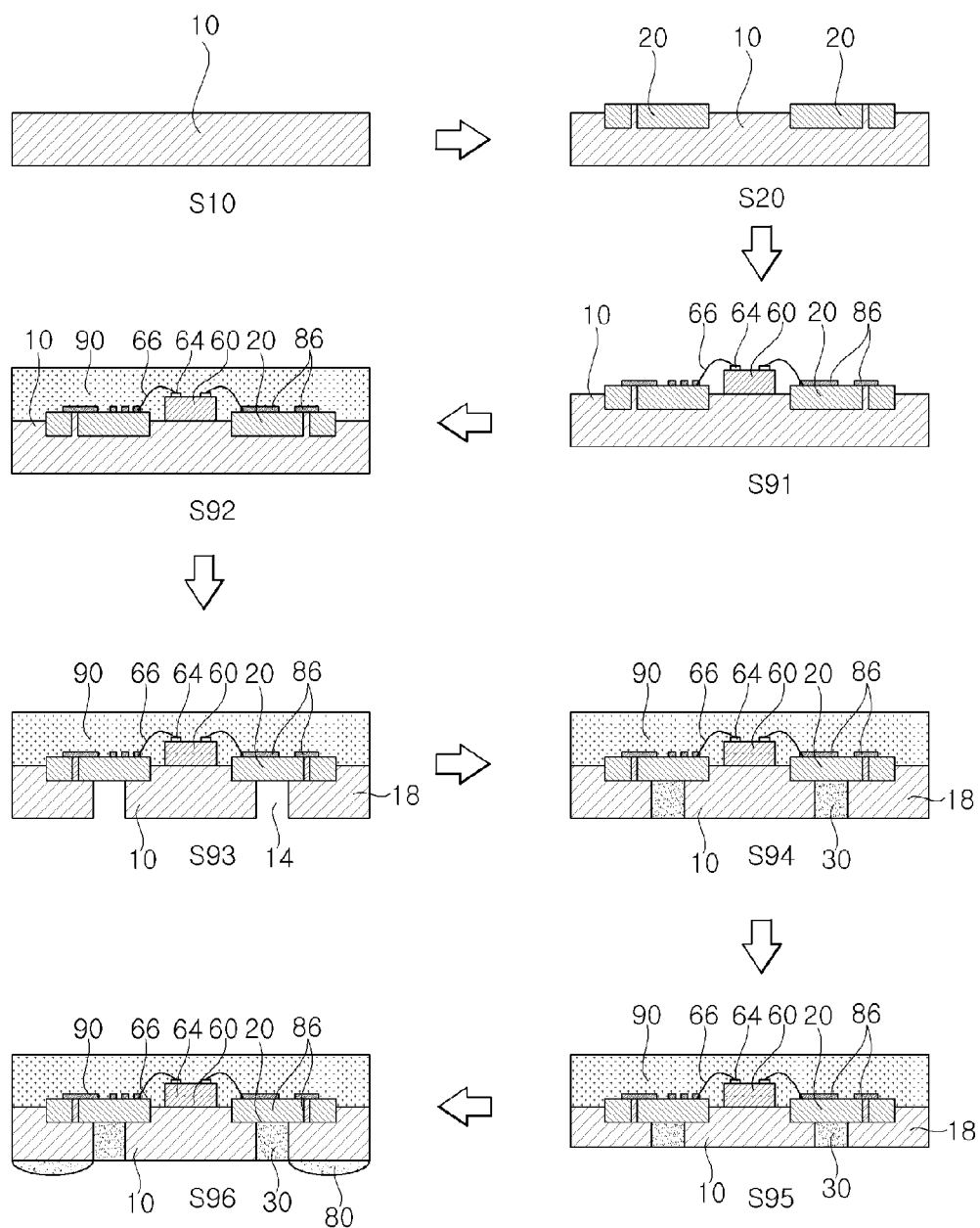
FIG. 23 is a process diagram of a terminal-integrated package method for a metal base package module according to an eighteenth exemplary embodiment of the present invention.
Figure 24:
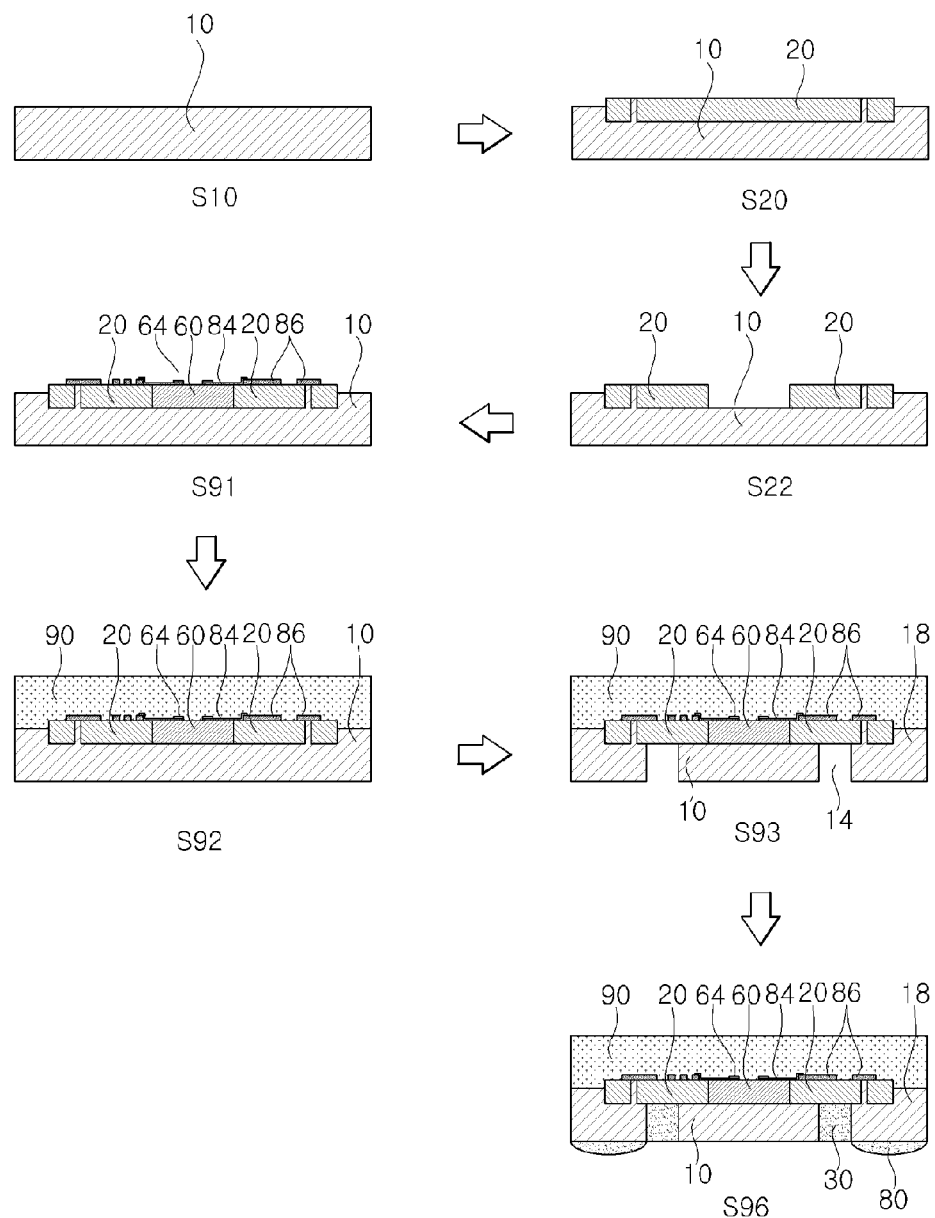
FIG. 24 is a process diagram of a terminal-integrated package method for a metal base package module according to a nineteenth exemplary embodiment of the present invention.

FIG. 23 and FIG. 24 illustrate terminal-integrated package methods for a metal base package module according to an eighteenth exemplary embodiment and a nineteenth exemplary embodiment of the present invention. The terminal-integrated package methods according to the eighteenth and nineteenth exemplary embodiments of the present invention are realized by applying the terminal-integrated package method for the metal base package module according to the seventeenth exemplary embodiment of the present invention respectively to the Korean Patent No. 10-0656295 and 10-0656300.

Figure 25:
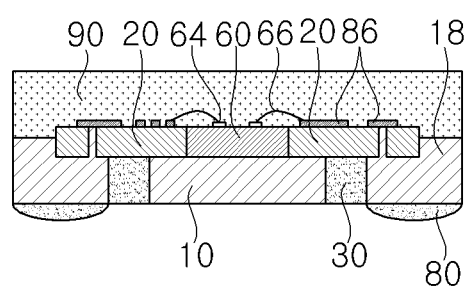
FIG. 25 is a cross-sectional view of a terminal-integrated metal base package module according to an exemplary embodiment of the present invention, manufactured by applying the terminal-integrated package method for the metal base package module according to the seventeenth exemplary embodiment of the present invention, corresponding to FIG. 3.

FIG. 25 illustrates a terminal-integrated metal base package module manufactured by applying the Korean Patent No. 10-2007-0076676 to the terminal-integrated package method for the metal base package module according to the seventeenth exemplary embodiment of the present invention.

Figure 26:
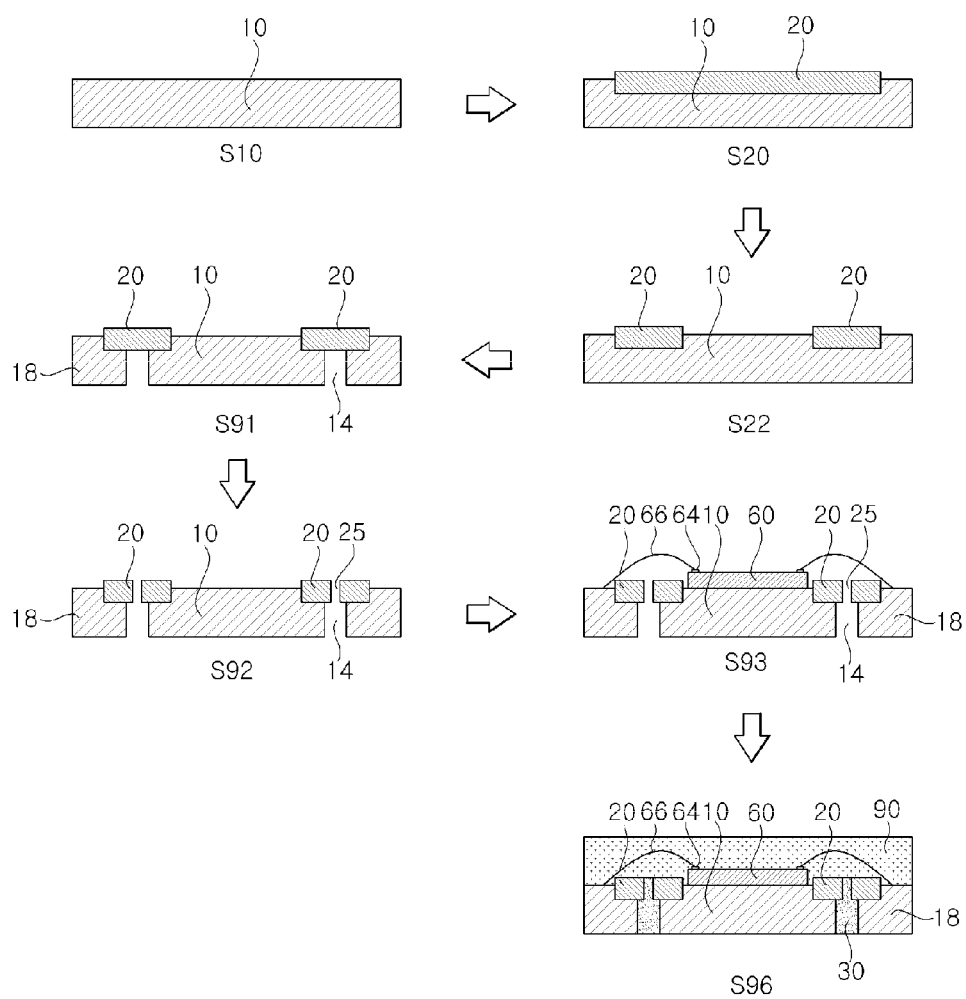
FIG. 26 is a process view of a terminal-integrated package method for a metal base package module according to a twentieth exemplary embodiment of the present invention.

In addition, as shown in FIG. 26, a terminal-integrated package method for a metal base package module according to a twentieth exemplary embodiment of the present invention includes forming a through-hole 25 in an oxide layer 20 during a process (S30) for forming an insulation groove 14 and forming insulation layers 30 and 40 and a molding layer 90 by being simultaneously filled in the top and bottom sides through the through-hole 25.

The forming of the through-hole 25 may use a chemical etching method or a mechanical treatment method.

As described, when the insulation layers 30 and 40 are simultaneously formed through the through-hole 25 while forming the molding layer 90 by forming the through-hole 25, the process cost can be reduced, and adhesion strength of a molding material (e.g., EMC) that forms the molding layer 90 is increased (i.e., the molding layer 90 and the insulating layers 30 and 40 are pined to each other so that adhesion strength is increased) so that durability of the entire package module can be improved.

The method according to the twentieth exemplary embodiment may be applied to the second exemplary embodiment, the ninth exemplary embodiment to the twelfth exemplary embodiment, and the fourteenth exemplary embodiment to the nineteenth exemplary embodiment.

Figure 27:
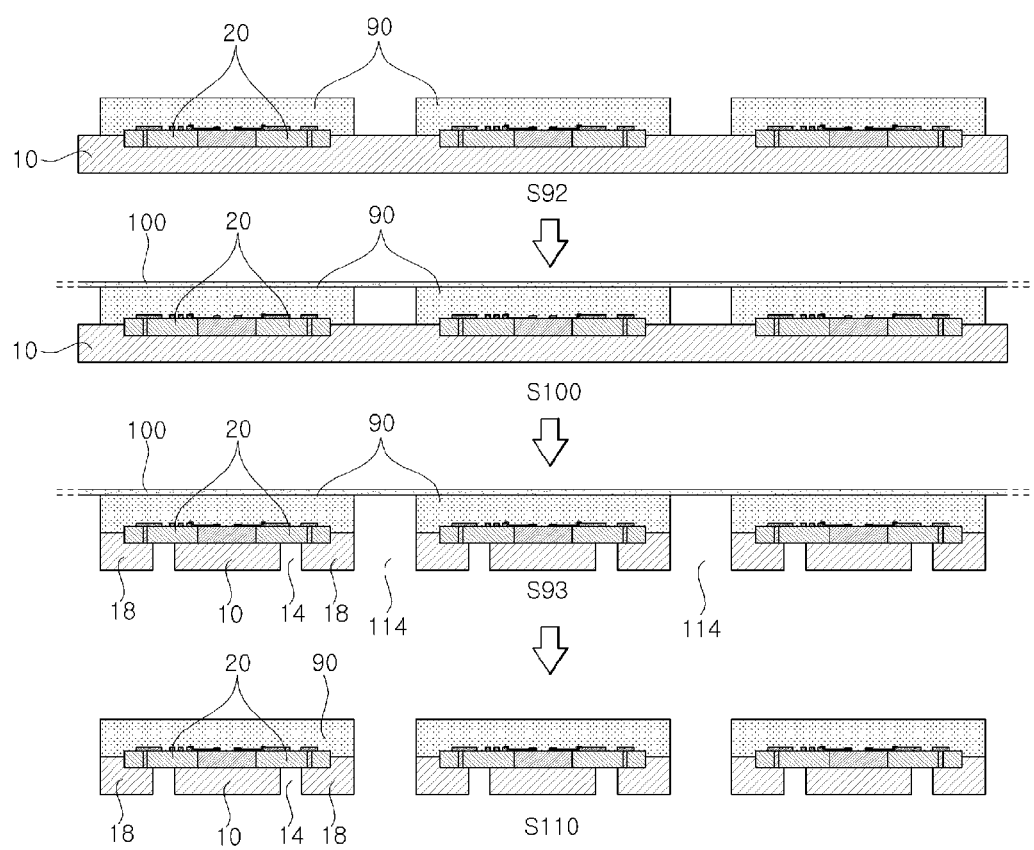
FIG. 27 is a process view of a terminal-integrated package method for a metal base package module according to a twenty-first exemplary embodiment of the present invention.
Figure 28:
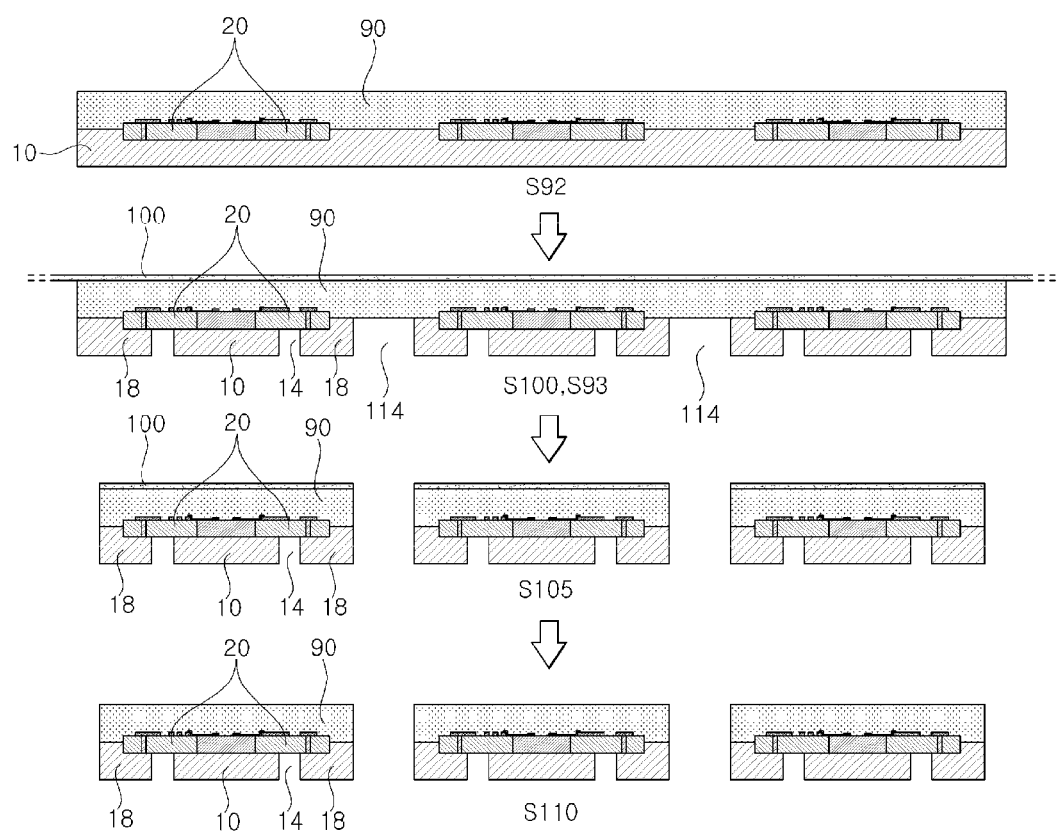
FIG. 28 is a process view of a terminal-integrated package method for a metal base package module according to a twenty-second exemplary embodiment of the present invention.

In addition, as shown in FIG. 27 and FIG. 28, in a terminal-integrated package method for the metal base package module according to the twelfth exemplary embodiment of the present invention and the fourteenth exemplary embodiment to the twentieth exemplary embodiment of the present invention, a process for cutting a chip manufactured as a wafer level package (WLP) for each unit module may performed during the process (S93) for forming the insulation groove 14 and the separation groove 16.

For example, as shown in FIG. 27, a terminal-integrated package method for a metal base package module according to a twenty-first exemplary embodiment of the present invention may include: forming a molding layer 90 by performing a molding treatment on an electronic part 60, wire bonding 66, an external wiring 84, and an internal wiring 86 (S92); attaching a protection layer 100 to the surface of the molding layer 90 to prevent deformation or breakage (S100); forming a cut-out groove 114 performing separation for each unit module while forming an insulation groove 14 and a separation groove 16 to an oxide layer 20 at the bottom side of a metal substrate 10 (S93); and performing separation for each unit module while eliminating the protection layer 100 (S110).

The protection layer 100 may be formed with, for example, a tape, a dummy wafer (inexpensive reusable wafer), or a film.

In the twenty-first exemplary embodiment, for the case of each of the separated unit modules, a process (S94) for forming insulating layers 30 and 40 by filling the insulation groove 14 and the separation groove 16 with an insulation material may further be performed.

In generation, when a chip is completed on a wafer through a semiconductor manufacturing process, a sawing process is performed to cut-out each chip. The sawing process uses a small diamond blade, and saw cutting may be used for an aluminum wafer.

The sawing process requires molding frame for a cutting work and manufacturing of the molding frame increases the cost of production, and chips in different size require the corresponding size of molding frame so that it has an economic problem.

Thus, according to the present invention, cutting and separation for each unit module (e.g., chip) can be easily performed through a chemical etching process during the process for forming the external connection terminals 18 so that the cutting process can be very easily performed, and productivity and economical efficiency can be remarkably improved.

In addition, as shown in FIG. 28, a terminal-integrated package method for a metal base package module according to a twenty-second exemplary embodiment of the present invention includes: forming a molding layer 90 by performing a molding treatment on an electronic part 60, wire bonding 66, an external wiring 84, and an internal wiring 86 (S92); attaching a protection layer 100 to the surface of the molding layer 90 to prevent deformation or breakage (S100); forming an cutting groove 114 separating each unit module while forming an insulation groove 14 and a separation groove 16 to an oxide layer 20 from the bottom side of a metal substrate 10 (S93); separating each unit module by saw-cutting the molding layer 90 at a portion where the cutting groove 114 is formed (S115); and eliminating the protection layer 100 (S110).

In the twenty-second exemplary embodiment, a molding frame for the saw cutting process is not required because the cutting groove 114 is formed, and therefore productivity and economic efficiency can be further improved compared to a conventional cutting process.

In addition, in the twenty-second exemplary embodiment, a process (S94) for forming insulating layers 30 and 40 by filling the insulation groove 14 and the separation groove 16 with an insulation material may further be performed for the case of respectively separated unit modules, as necessary.

In the twelfth exemplary embodiment and the fourteenth exemplary embodiment to the twenty-second exemplary embodiments, a spin coating method may be used instead of a general injection method during the molding treatment, and a semi-hardened molding material may be attached, or molding powders may be directly coated on an upper plate and then coated over the entire surface by being melt with heat.

In addition, in the twelfth exemplary embodiment and the fourteenth exemplary embodiment to the twenty-second exemplary embodiment, a protection layer protection the upper portion may be formed using a metal cap, a ceramic cap, a plastic cap, and the like during the molding treatment.

The terminal-integrated metal base package module and the terminal-integrated package method for the metal base package module according to the present invention have been described, but it is to be understood that the invention is not limited to the disclosed embodiments, but, on the contrary, is intended to cover various modifications and equivalent arrangements included within the spirit and scope of the appended claims.

What is claimed is:

1. A terminal-integrated package method for a metal base package module, comprising:
    preparing a metal substrate formed with a conductive metal material;
    forming an oxide layer by anodic oxidizing one side of the metal substrate to a predetermined depth;
    forming an insulation groove by partially eliminating the metal substrate to expose the oxide layer with a constant width along the circumference of the metal substrate from an opposite side of the metal substrate to form an inner portion and a circumference portion of the metal substrate, wherein the oxide layer supports the inner portion and the circumference portion of the metal substrate;
    forming a plurality of external connection terminals by forming a separation groove by eliminating the circumference portion of the metal substrate, disconnected with a center portion thereof by the insulation groove along the circumference with a predetermined gap, wherein the oxide layer supports the plurality of external connection terminals;
    mounting or manufacturing an electronic part on the metal substrate or the oxide layer; and
    electrically connecting an electrode of the electronic part with the external connection terminal.

2. The terminal-integrated package method of claim 1, further comprising forming a molding layer by performing a molding treatment to surround a connection portion of the electronic part and the external connection terminal.

3. The terminal-integrated package method of claim 1, wherein further comprising forming a protection layer by installing a cap at an upper portion to protect a connection portion of the electronic part and the external connection terminal.

4. The terminal-integrated package method of claim 1, wherein further comprising filling the insulation groove and the separation groove with an insulation material.

5. The terminal-integrated package method of claim 1, wherein further comprising forming an adhesive pad at a bottom side of the external connection terminal.

6. The terminal-integrated package method of claim 1, wherein further comprising forming an external wiring or an internal wiring on the oxide layer and the external connection terminal, and connecting an electrode of the electronic part with the internal wiring through wire bonding.

7. The terminal-integrated package method of claim 1, wherein further comprising forming a via electrode in the oxide layer for connection with the external connection terminal and electrically connecting the electronic part with the via electrode.

8. The terminal-integrated package method of claim 1, further comprising
    when oxidization is performed to form the oxide layer, the via electrode is directly formed on the oxide layer by not partially oxidizing the metal substrate, located at a portion where the external connection terminal is to be formed and electrically connecting the electronic part with the via electrode.

9. The terminal-integrated package method of claim 1, further comprising
forming a through-out hole, connected with the insulation groove, in the oxide layer and
forming an insulating layer by filling the insulation groove and the separation groove with a molding material through the through-hole while forming a molding layer using the molding material to surround a connection portion of the electronic part and the external connection terminal.

10. A terminal-integrated package method for a metal base package module, comprising:
preparing a metal substrate formed with a conductive metal material;
forming an oxide layer by anodic oxidizing one side of the metal substrate to a predetermined depth;
mounting or manufacturing an electronic part on the metal substrate or the oxide layer;
forming an insulation groove by partially eliminating the metal substrate to expose the oxide layer with a constant width along the circumference of the metal substrate from an opposite side of the metal substrate to form an inner portion and a circumference portion of the metal substrate, wherein the oxide layer supports the inner portion and the circumference portion of the metal substrate;
forming a plurality of external connection terminals by forming a separation groove by eliminating the circumference portion of the metal substrate, disconnected with a center portion thereof by the insulation groove along the circumference with a predetermined gap, wherein the oxide layer supports the plurality of external connection terminals; and
electrically connecting an electrode of the electronic part with the external connection terminal.

* * * * *